(12) United States Patent
Choi et al.

(10) Patent No.: US 12,538,488 B2
(45) Date of Patent: Jan. 27, 2026

(54) MEMORY DEVICE WITH MULTI CHANNEL STRUCTURES AND METHOD OF MANUFACTURING THE SAME

(71) Applicant: SK hynix Inc., Icheon-si (KR)

(72) Inventors: Won Geun Choi, Icheon-si (KR); Mi Seong Park, Icheon-si (KR); In Su Park, Icheon-si (KR); Jung Shik Jang, Icheon-si (KR); Jung Dal Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 330 days.

(21) Appl. No.: 18/106,306

(22) Filed: Feb. 6, 2023

(65) Prior Publication Data

US 2024/0049466 A1 Feb. 8, 2024

(30) Foreign Application Priority Data

Aug. 3, 2022 (KR) .................. 10-2022-0096437

(51) Int. Cl.
*H10B 43/27* (2023.01)

(52) U.S. Cl.
CPC .................................. *H10B 43/27* (2023.02)

(58) Field of Classification Search
CPC ........ H10B 43/10; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/20; H10B 43/23; H10B 43/27; H10B 43/30; H10B 43/35; H10B 43/40; H10B 43/50; H10B 51/00; H10B 51/10; H10B 51/20;
(Continued)

(56) References Cited

U.S. PATENT DOCUMENTS 11,716,847 B2 *  8/2023  Gao .................... H01L 23/5226
2016/0013204 A1  1/2016  Sakui
(Continued)

FOREIGN PATENT DOCUMENTS

CN      112437984 A    3/2021
CN      112470276 A    3/2021
(Continued)

*Primary Examiner* — William B Partridge
*Assistant Examiner* — Gustavo G Ramallo
(74) *Attorney, Agent, or Firm* — WILLIAM PARK AND ASSOCIATES LTD.

(57) ABSTRACT

A memory device, and a method of manufacturing the same, includes a stacked structure including gate lines stacked to be spaced apart from each other. The memory device also includes a first channel structure vertical to the gate lines and including a major axis in a first direction. The memory device further includes a second channel structure configured to separate the first channel structure and including a major axis in a second direction orthogonal to the first direction. The first channel structure includes a first memory cell group and a second memory cell group separated from each other by the second channel structure. The second channel structure includes a third memory cell group and a fourth memory cell group separated from each other in the second direction.

21 Claims, 51 Drawing Sheets

(58) Field of Classification Search
CPC ........ H10B 51/30; H10B 51/40; H10B 51/50; H01L 27/1027; H01L 27/1028
See application file for complete search history.

(56) References Cited

U.S. PATENT DOCUMENTS

| | | | |
|---|---|---|---|
| 2018/0019257 A1* | 1/2018 | Son | H10B 43/30 |
| 2018/0277554 A1 | 9/2018 | Kaneko | |
| 2020/0098767 A1* | 3/2020 | Morooka | H10B 41/50 |
| 2020/0343307 A1 | 10/2020 | Lee et al. | |
| 2022/0013537 A1 | 1/2022 | Geng et al. | |
| 2023/0016278 A1* | 1/2023 | Choi | H10B 43/27 |
| 2024/0170068 A1* | 5/2024 | Mun | G11C 16/08 |

FOREIGN PATENT DOCUMENTS

| | | |
|---|---|---|
| JP | 2020047819 A | 3/2020 |
| KR | 1020180008959 A | 1/2018 |
| KR | 1020180073161 A | 7/2018 |
| KR | 1020210010210 A | 1/2021 |
| KR | 1020230011221 A | 1/2023 |

* cited by examiner

MEMORY DEVICE WITH MULTI CHANNEL STRUCTURES AND METHOD OF MANUFACTURING THE SAME

CROSS-REFERENCE TO RELATED APPLICATION

The present application claims priority under 35 U.S.C. § 119(a) to Korean patent application number 10-2022-0096437, filed on Aug. 3, 2022, in the Korean Intellectual Property Office, the entire disclosure of which is incorporated herein by reference.

BACKGROUND

1. Technical Field

Various embodiments of the present disclosure relate to a memory device and a method of manufacturing the memory device, and more particularly, to a three-dimensional (3D) memory device and a method of manufacturing the 3D memory device.

2. Related Art

Memory devices may be classified as volatile memory devices in which stored data is lost when the supply of power is interrupted or nonvolatile memory devices in which stored data is retained even when the supply of power is interrupted.

Examples of nonvolatile memory devices may include NAND flash memory, NOR flash memory, resistive memory (or resistive random access memory: ReRAM), phase-change random access memory (PRAM), magnetoresistive random access memory (MRAM), ferroelectric random access memory (FRAM), spin transfer torque random access memory (STT-RAM), etc.

Among the examples of nonvolatile memory devices, a NAND flash memory device may include a memory cell array which stores data, and peripheral circuits which perform a program operation, a read operation, or an erase operation in response to a command transmitted from a memory controller.

The memory cell array may include a plurality of memory blocks, each of which may include a plurality of memory cells.

SUMMARY

In accordance with an embodiment of the present disclosure is a memory device including: a stacked structure including gate lines stacked to be spaced apart from each other; a first channel structure vertical to the gate lines and including a major axis in a first direction; and a second channel structure configured to separate the first channel structure, and including a major axis in a second direction orthogonal to the first direction. The first channel structure includes a first memory cell group and a second memory cell group separated from each other by the second channel structure. The second channel structure includes a third memory cell group and a fourth memory cell group separated from each other in the second direction.

In accordance with the present disclosure is a method of manufacturing a memory device. The method includes: forming a stacked structure including gate lines on a lower structure; forming a first channel structure arranged in a direction vertical to the gate lines; forming a second channel structure configured to separate memory cells included in the first channel structure into first and second memory cell groups; and separating memory cells included in the second channel structure into third and fourth memory cell groups.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms and should not be construed as being limited to the embodiments described in the specification or application.

Various embodiments of the present disclosure are directed to a memory device that enables the degree of integration to be improved and a method of manufacturing the memory device.

Figure 1:
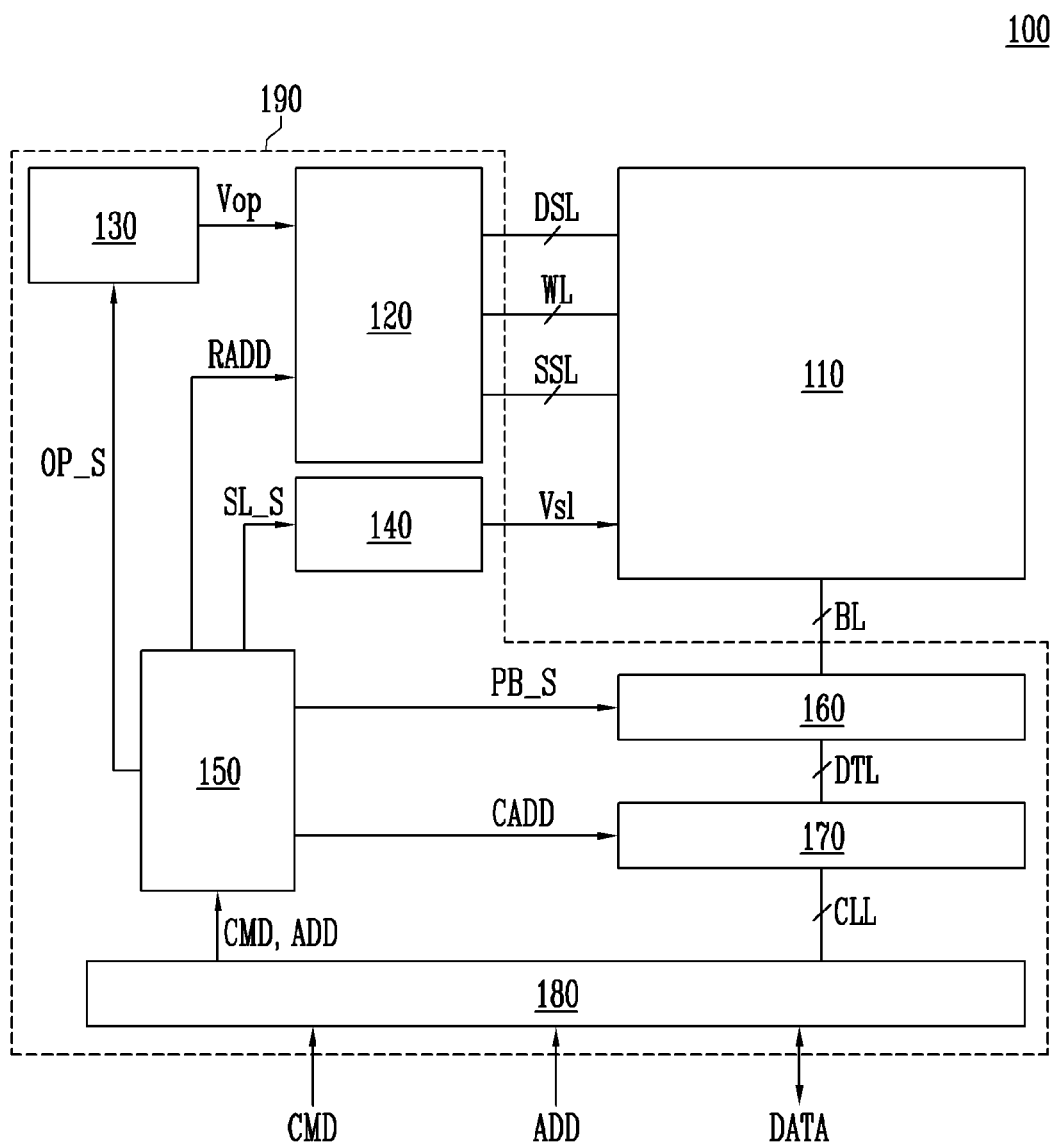
FIG. 1 is a diagram illustrating a memory device according to an embodiment of the present disclosure.

FIG. 1 is a diagram illustrating a memory device according to an embodiment of the present disclosure.

Referring to FIG. 1, a memory device 100 may include a peripheral circuit 190 and a memory cell array 110.

The peripheral circuit 190 may perform a program operation of storing data in the memory cell array 110 and a verify operation, perform a read operation of outputting data stored in the memory cell array 110, or perform an erase operation of erasing data stored in the memory cell array 110. The peripheral circuit 190 may include a voltage generation circuit 130, a row decoder 120, a source line driver 140, a control circuit 150, a page buffer 160, a column decoder 170, and an input-output circuit 180.

The memory cell array 110 may include a plurality of memory cells in which data is stored. In an embodiment, the memory cell array 110 may be a three-dimensional (3D) memory cell array. Each of the plurality of memory cells may store single-bit data or multi-bit data of two or more bits depending on the program scheme. The plurality of memory cells may form a plurality of strings. Memory cells included in each of the strings may be electrically connected to each other through channels. Channels included in the strings may be coupled to the page buffer 160 through bit lines BL.

The voltage generation circuit 130 may generate various operating voltages Vop to be used in a program operation, a read operation, or an erase operation in response to an operation signal OP_S. For example, the voltage generation circuit 130 may selectively generate and output operating voltages Vop, including a program voltage, a verify voltage, a pass voltage, a read voltage, an erase voltage, etc.

The row decoder 120 may be coupled to the memory cell array 110 through a plurality of drain selection lines DSL, a plurality of word lines WL, and a plurality of source selection lines SSL. The row decoder 120 may transfer the operating voltages Vop to the plurality of drain selection lines DSL, the plurality of word lines WL, and the plurality of source selection lines SSL in response to a row address RADD.

The source line driver 140 may transmit a source voltage Vsl to the memory cell array 110 in response to a source line signal SL_S. For example, the source voltage Vsl may be transferred to a source line coupled to the memory cell array.

The control circuit 150 may output the operation signal OP_S, the row address RADD, the source line control signal SL_S, a page buffer control signal PB_S, and a column address CADD in response to a command CMD and an address ADD.

The page buffer 160 may be coupled to the memory cell array 110 through the bit lines BL. The page buffer 160 may temporarily store data DATA received through the plurality of bits lines BL in response to the page buffer control signal PB_S. The page buffer 160 may sense the voltages or currents of the plurality of bit lines BL during a read operation.

The column decoder 170 may transmit data DATA, received from the input-output circuit 180, to the page buffer 160 or transmit data DATA, stored in the page buffer 160, to the input-output circuit 180 in response to the column address CADD. The column decoder 170 may exchange the data DATA with the input-output circuit 180 through column lines CLL and may exchange data DATA with the page buffer 160 through data lines DTL.

The input-output circuit 180 may transfer a command CMD and an address ADD, received from an external device (e.g., a controller) coupled to the memory device 100, to the control circuit 150, and may output data, received from the column decoder 170, to the external device.

Figure 2:
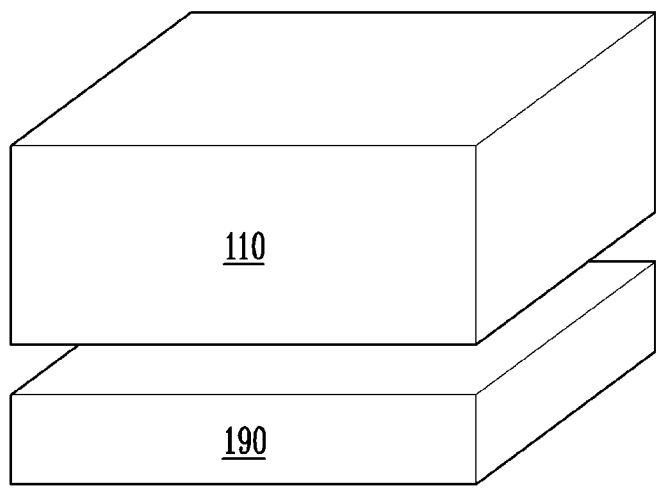
FIG. 2 is a diagram illustrating an arrangement structure of a memory cell array and a peripheral circuit.

FIG. 2 is a diagram illustrating an arrangement structure of a memory cell array 110 and a peripheral circuit 190.

Referring to FIG. 2, the memory cell array 110 may be stacked on the peripheral circuit 190. For example, when a substrate is formed along an X-Y plane, the peripheral circuit 190 may be stacked in a Z direction from the substrate, and the memory cell array 110 may be stacked on the peripheral circuit 190.

Figure 3:
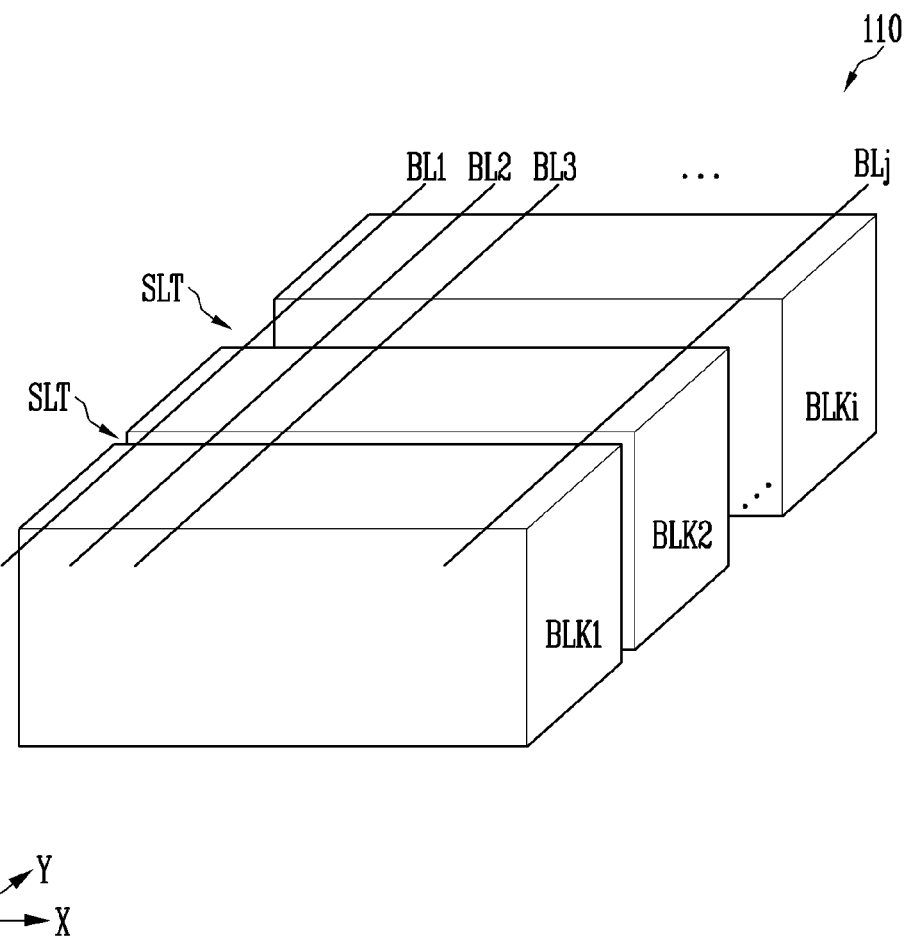
FIG. 3 is a diagram illustrating the structure of a memory cell array.

FIG. 3 is a diagram illustrating the structure of the memory cell array.

Referring to FIG. 3, the memory cell array 110 may include first to i-th memory blocks BLK1 to BLKi (where i is a positive integer). The first to i-th memory blocks BLK1 to BLKi may be spaced apart from each other in a Y direction and may be coupled in common to first to j-th bit lines BL1 to BLj. For example, the first to j-th bit lines BL1 to BLj may extend in the Y direction and may be spaced apart from each other in an X direction. The first to i-th memory blocks BLK1 to BLKi may be separated from each other by slits SLT.

Figure 4:
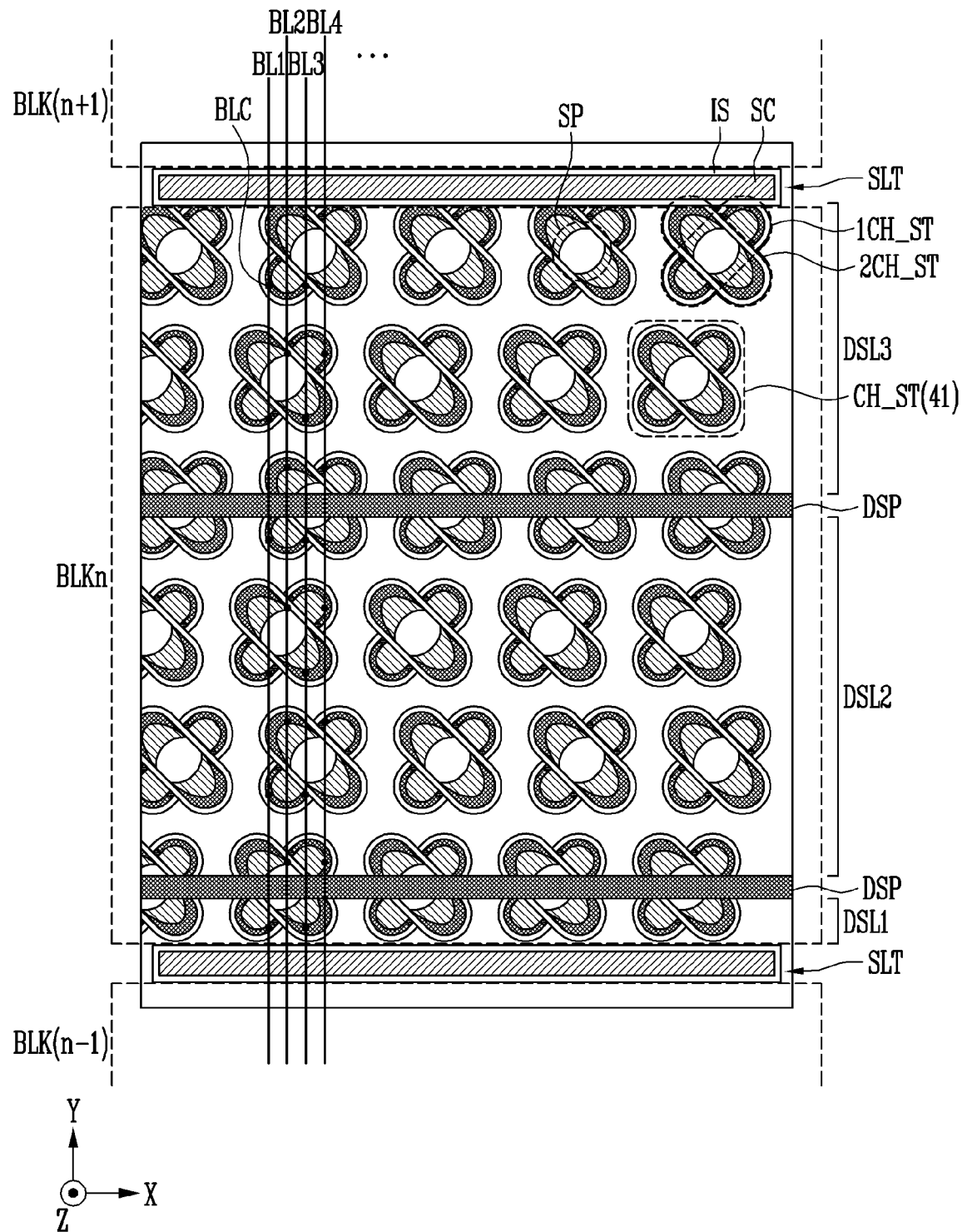
FIG. 4 is a view illustrating the layout of a memory device according to an embodiment of the present disclosure.

FIG. 4 is a view illustrating the layout of a memory device according to an embodiment of the present disclosure.

Referring to FIG. 4, a (n−1)-th memory block BLK(n−1), an n-th memory block BLKn, and a (n+1)-th memory block BLK(n+1), which are included in the memory device, may be spaced apart from each other in a Y direction. The (n−1)-th memory block BLK(n−1), the n-th memory block BLKn, and the (n+1)-th memory block BLK(n+1) may be configured in the same manner and may be separated from each other by slits SLT.

Because the (n−1)-th memory block BLK(n−1), the n-th memory block BLKn, and the (n+1)-th memory block BLK(n+1) may be configured in the same manner, the n-th memory block BLKn, among the memory blocks, will be described in detail by way of example.

The n-th memory block BLKn may include a plurality of channel structures CH_ST. The channel structures CH_ST may include memory cells. Each of the channel structures CH_ST may include first and second channel structures 1CH_ST and 2CH_ST. The second channel structure 2CH_ST may penetrate the first channel structure 1CH_ST in a direction vertical to gate lines. For example, the second channel structure 2CH_ST may penetrate a center portion of the first channel structure 1CH_ST, wherein the first channel structure 1CH_ST may be separated into first and second memory cell groups by the second channel structure 2CH_ST, and the second channel structure 2CH_ST may be separated into third and fourth memory cell groups with respect to a separation pattern SP, shown in FIG. 5.

Because different bit lines BL are coupled to the first and second channel structures 1CH_ST and 2CH_ST, memory cells included in the first and second channel structures 1CH_ST and 2CH_ST may form different strings. For example, the first channel structure 1CH_ST may be coupled to a first bit line BL1 through a bit line contact BLC, and the second channel structure 2CH_ST may be coupled to a second bit line BL2 through a bit line contact BLC.

The n-th memory block BLKn may include at least one drain separation pattern DSP. The drain separation pattern DSP may be a structure for separating gate lines included in the corresponding memory block. For example, as illustrated in FIG. 4, the drain selection lines DSL may be separated into first, second and third drain selection lines DSL1, DSL2, and DSL3 by the drain separation patterns DSP. Different voltages may be applied to the first to third drain selection lines DSL1 to DSL3 separated from each other.

The memory cells formed in a channel structure region 41 will be described in detail below.

Figure 5:
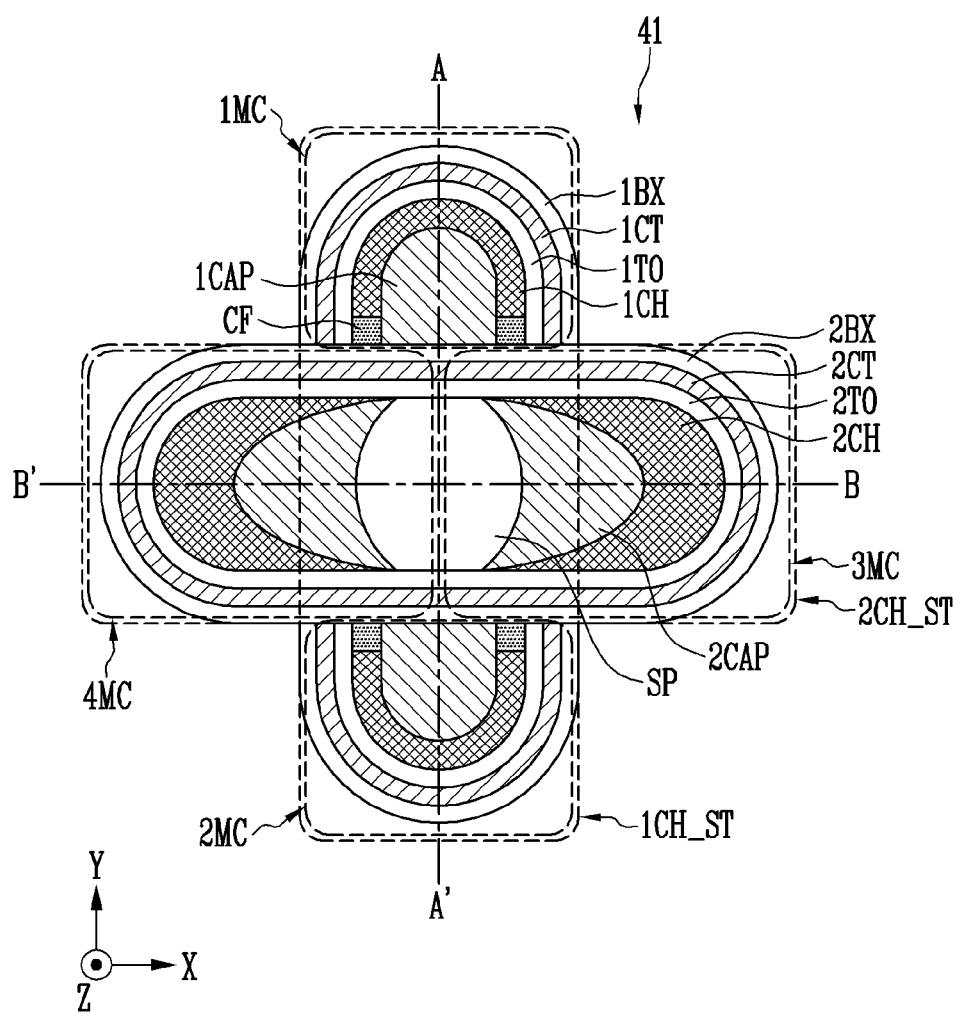
FIG. 5 illustrates a layout for describing the structure of memory cells according to an embodiment of the present disclosure.

FIG. 5 illustrates a layout for describing the structure of memory cells according to an embodiment of the present disclosure.

Referring to FIG. 5, first and second channel structures 1CH_ST and 2CH_ST may be included in a channel structure region 41. The first and second channel structures 1CH_ST and 2CH_ST may be spaced apart from each other in an X-axis direction and may individually extend in a Y-axis direction. The first channel structure 1CH_ST may have a major axis in a first direction, and the second channel structure 2CH_ST may have a major axis in a second direction orthogonal to the first direction. For example, the first channel structure 1CH_ST may have the major axis in the X-axis direction, and the second channel structure 2CH_ST may have the major axis in the Y-axis direction. The first channel structure 1CH_ST may be separated into first and second memory cell groups 1MC and 2MC by the second channel structure 2CH_ST penetrating the first channel structure 1CH_ST. The second channel structure 2CH_ST may be separated into third and fourth memory cell groups 3MC and 4MC with respect to a separation pattern SP.

The first channel structure 1CH_ST may include the first and second memory cell groups 1MC and 2MC separated from each other by the second channel structure 2CH_ST. The structure of the first memory cell group 1MC may be formed to be symmetrical to the structure of the second memory cell group 2MC with respect to the second channel structure 2CH_ST.

The second channel structure 2CH_ST may include the third and fourth memory cell groups 3MC and 4MC symmetrical to each other with respect to the separation pattern SP. The third memory cell group 3MC may be formed to have the same structure as the fourth memory cell group 4MC.

The first channel structure 1CH_ST may include a first capping layer 1CAP, a first channel layer 1CH, a first tunnel insulating layer 1TO, a first charge trap layer 1CT, and a first blocking layer 1BX. The second channel structure 2CH_ST may include the separation pattern SP, a second capping layer 2CAP, a second channel layer 2CH, a second tunnel insulating layer 2TO, a second charge trap layer 2CT, and a second blocking layer 2BX. The second channel structure 2CH_ST is formed to be similar to the first channel structure 1CH_ST, and thus, the first channel structure 1CH_ST will be described in detail below.

The first capping layer 1CAP may be formed in an upper portion of the first channel structure 1CH_ST formed in a Z-axis direction vertical to the substrate and may be used to improve electrical characteristics of drain select transistors. For example, the first capping layer 1CAP may be formed of a conductive material. For example, the first capping layer 1CAP may be formed of a doped polysilicon layer. Although not in illustrated in FIG. 5, a core pillar may be formed under the first capping layer 1CAP. For example, the core pillar may be made of an insulating material or a conductive material. The first channel layer 1CH may be formed to enclose the first capping layer 1CAP and the core pillar and may be made of a semiconductor material. For example, the first channel layer 1CH may be formed of a polysilicon layer. The first tunnel insulating layer 1TO may be formed to enclose the first channel layer 1CH and may be made of an insulating material. For example, the first tunnel insulating layer 1TO may be formed of an oxide layer or a silicon oxide layer. The first charge trap layer 1CT may be formed to enclose the first tunnel insulating layer 1TO and may be made of a material capable of trapping electrons. For example, the first charge trap layer 1CT may be formed of a nitride layer. The first blocking layer 1BX may be formed to enclose the first charge trap layer 1CT and may be made of an insulating material. For example, the first blocking layer 1BX may be formed of an oxide layer or a silicon oxide layer.

Unlike the second channel structure 2CH_ST, the first channel structure 1CH_ST may further include a compensation layer CF. However, the compensation layer CF may be a selective element and may be omitted. The compensation layer CF may protect the surface of the first channel structure 1CH_ST exposed in an etching process performed to form the second channel structure 2CH_ST. The compensation layer CF may be formed in a region in which the first channel structure 1CH_ST contacts the second channel structure 2CH_ST.

The first capping layer 1CAP, the core pillar, the first channel layer 1CH, the first tunnel insulating layer 1TO, the first charge trap layer 1CT, and the first blocking layer 1BX, which are included in the first and second memory cell groups 1MC and 2MC, may be separated by the second channel structure 2CH_ST.

Unlike the first channel structure 1CH_ST, the second channel structure 2CH_ST may further include the separation pattern SP. Each of the second capping layer 2CAP and the second channel layer 2CH of the second channel structure 2CH_ST may be separated in an X-axis direction by the separation pattern SP. The separation pattern SP may be made of an insulating material. For example, the separation pattern SP may be formed of an oxide layer or a silicon oxide layer.

Although the second capping layer 2CAP included in the second channel structure 2CH_ST is illustrated as being formed in an elliptical shape, it may be formed in various shapes. For example, when the second capping layer 2CAP is formed in an elliptical shape, the length of the minor axis of the second capping layer 2CAP may be greater than that of the minor axis of the second channel layer 2CH, and the length of the major axis of the second capping layer 2CAP may be formed to be less than the that of the major axis of the second channel layer 2CH. Although the separation pattern SP included in the second channel structure 2CH_ST is illustrated as being formed in a circular shape, it may be formed in various shapes. For example, when the separation pattern SP is formed in a circular shape, the diameter of the separation pattern SP may be greater than the length of the minor axis of the second channel layer 2CH Although not illustrated in the drawing, first to fourth memory cell group may be electrically connected to different bit lines through different bit line contacts. For example, the channel layer of the first memory cell group 1MC may be connected to a first bit line through the corresponding bit line contact, the channel layer of the second memory cell group 2MC may be connected to a second bit line through the corresponding bit line contact, the channel layer of the third memory cell group 3MC may be connected to a third bit line through the corresponding bit line contact, and the channel layer of the fourth memory cell group 4MC may be connected to a fourth bit line through the corresponding bit line contact.

The first and second channel structures 1CH_ST and 2CH_ST will be described in detail below with reference to FIG. 6.

Figure 6:
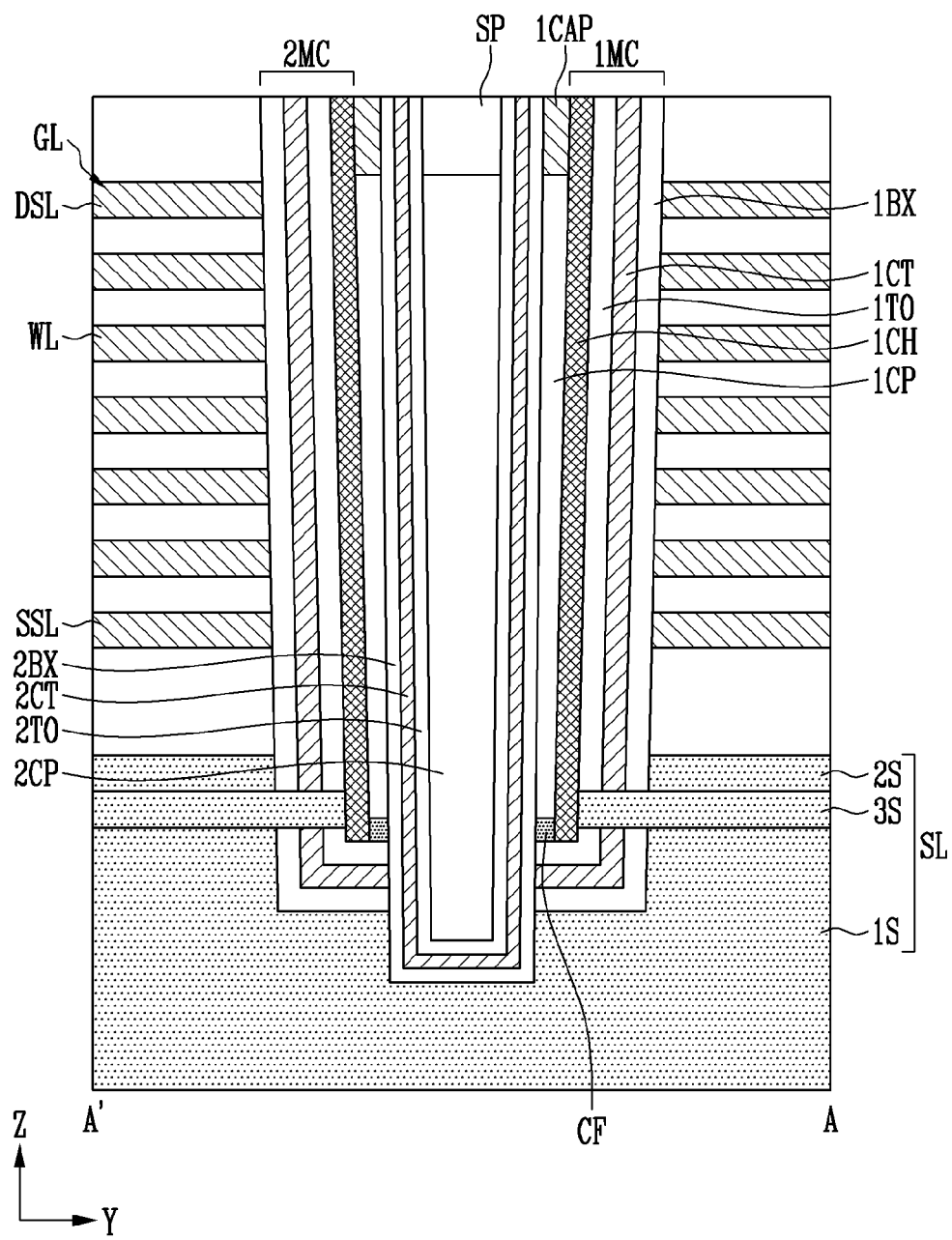
FIG. 6 is a sectional view in an X-axis direction for describing the structure of a memory cell group (1MC to 4MC) region according to an embodiment of the present disclosure.

FIG. 6 is a sectional view in an X-axis direction for describing the structure of a memory cell group (1MC to 4MC) region according to an embodiment of the present disclosure.

In FIG. 6, a sectional view of the first to fourth memory cell groups 1MC to 4MC of FIG. 5 taken along line A-A' is illustrated.

The first and second channel structures 1CH_ST and 2CH_ST may be formed on a source line SL while penetrating the gate lines GL in a Z-axis direction vertical to the gate lines GL. The first capping layer 1CAP, the first core pillar 1CP, the first channel layer 1CH, the first tunnel insulating layer 1TO, the first charge trap layer 1CT, and the first blocking layer 1BX of the first channel structure 1CH_ST may be separated by the second channel structure 2CH_ST. The first channel structure 1CH_ST may further include a compensation layer CF. However, the compensation layer CF may be a selective structure, and may be omitted.

The channel layer and the capping layer of the second channel structure 2CH_ST may be separated by the separation pattern SP. A second core pillar 2CP may be formed under the separation pattern SP, and the second tunnel insulating layer 2TO, the second charge trap layer 2CT, and the second blocking layer 2BX may be formed to enclose the separation pattern SP and the second core pillar 2CP.

Among the gate lines GL, lines formed in a lower portion may be used as a source selection line SSL, and lines formed in an upper portion may be used as a drain selection line DSL. The source selection line SSL may be coupled to a gate of a source select transistor, and the drain selection line DSL may be coupled to a gate of a drain select transistor. The source select transistor may be configured to electrically connect or disconnect the source line SL to or from the first channel layer 1CH in a string, and the drain select transistor may be configured to electrically connect or disconnect the corresponding bit line to or from the first channel layer 1CH in the string. Among the gate lines GL, lines formed between the source selection line SSL and the drain selection line DSL may be used as word lines WL. The word lines WL may be coupled to gates of memory cells.

Figure 7:
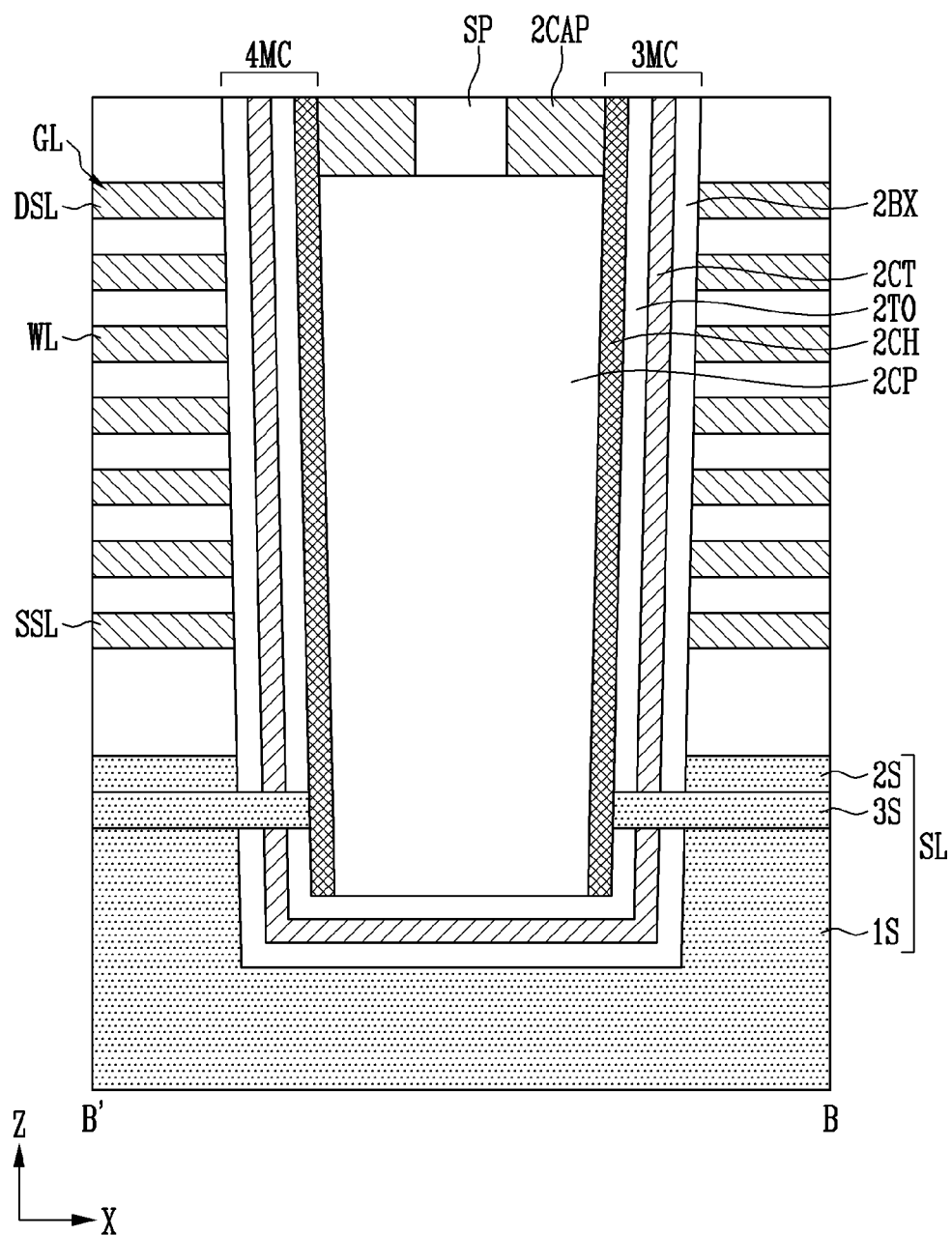
FIG. 7 is a sectional view in a Y-axis direction for describing the structure of a memory cell group (1MC to 4MC) region according to an embodiment of the present disclosure.

FIG. 7 is a sectional view in a Y-axis direction for describing the structure of a memory cell group (1MC to 4MC) region according to an embodiment of the present disclosure.

In FIG. 7, a sectional view of the first to fourth memory cell groups 1MC to 4MC of FIG. 5 taken along line B-B' is illustrated.

The second channel layer 2CH of the second channel structure 2CH_ST may be separated into the third and fourth memory cell groups 3MC and 4MC by the second core pillar 2CP, the second capping layer 2CAP, and the separation pattern SP, and the second capping layer 2CAP of the second channel structure 2CH_ST may be separated by the separation pattern SP. The second tunnel insulating layer 2TO, the second charge trap layer 2CT, and the second blocking layer 2BX may be formed to enclose the second channel layer 2CH and the second core pillar 2CP.

Figure 8A:
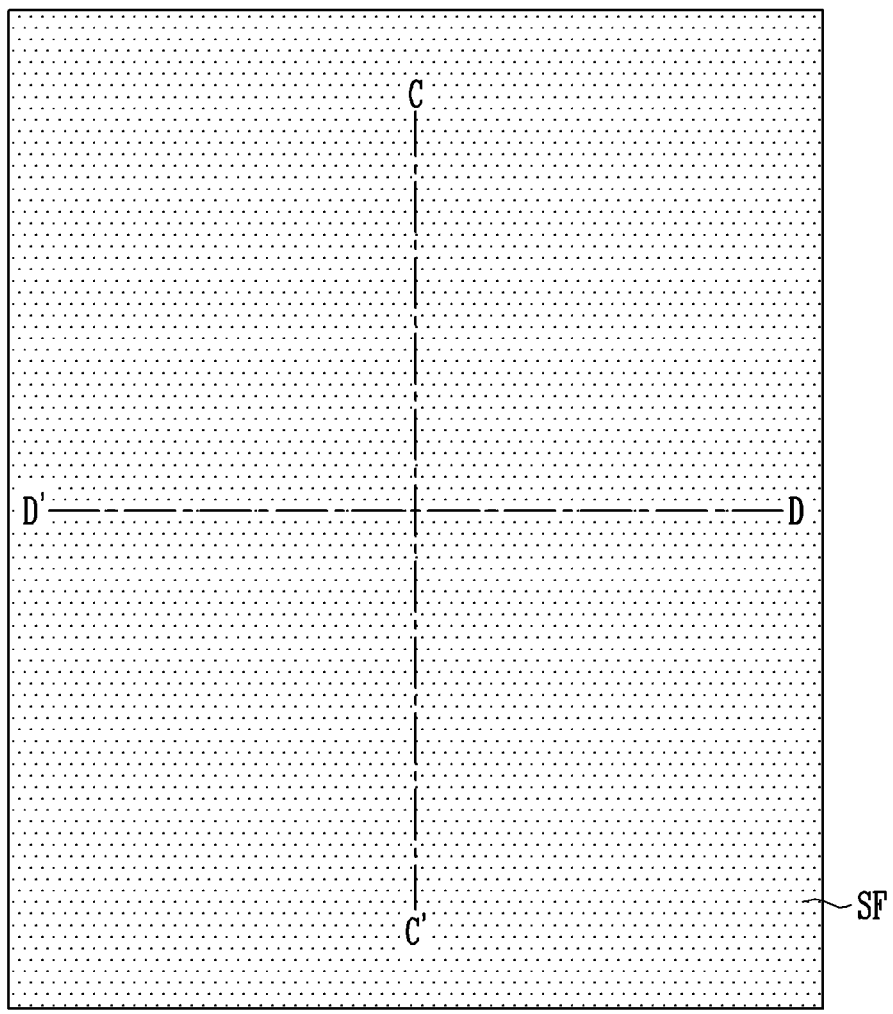
FIGS. 8A, 8B, 8C, 8D, 8E, 8F, 8G, 8H, 8I, 8J, 8K, and 8L illustrate layouts for describing a method of manufacturing a memory device according to an embodiment of the present disclosure.
Figure 8B:
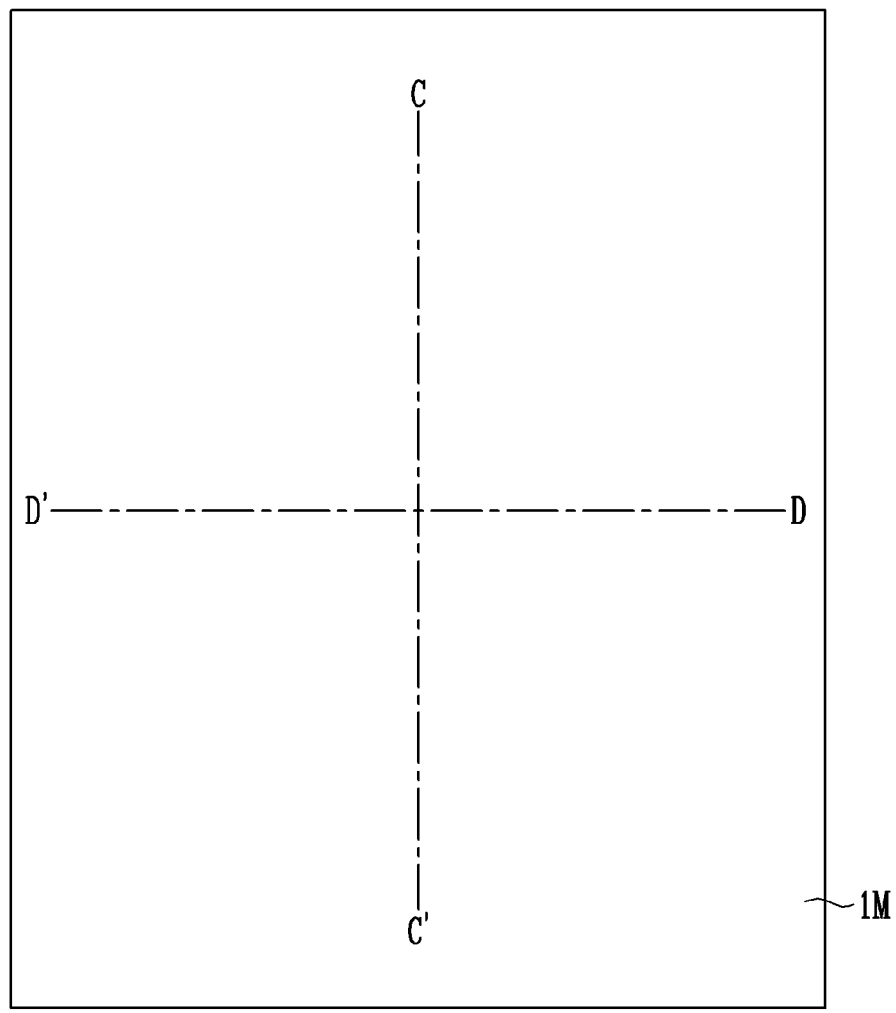
Figure 8C:
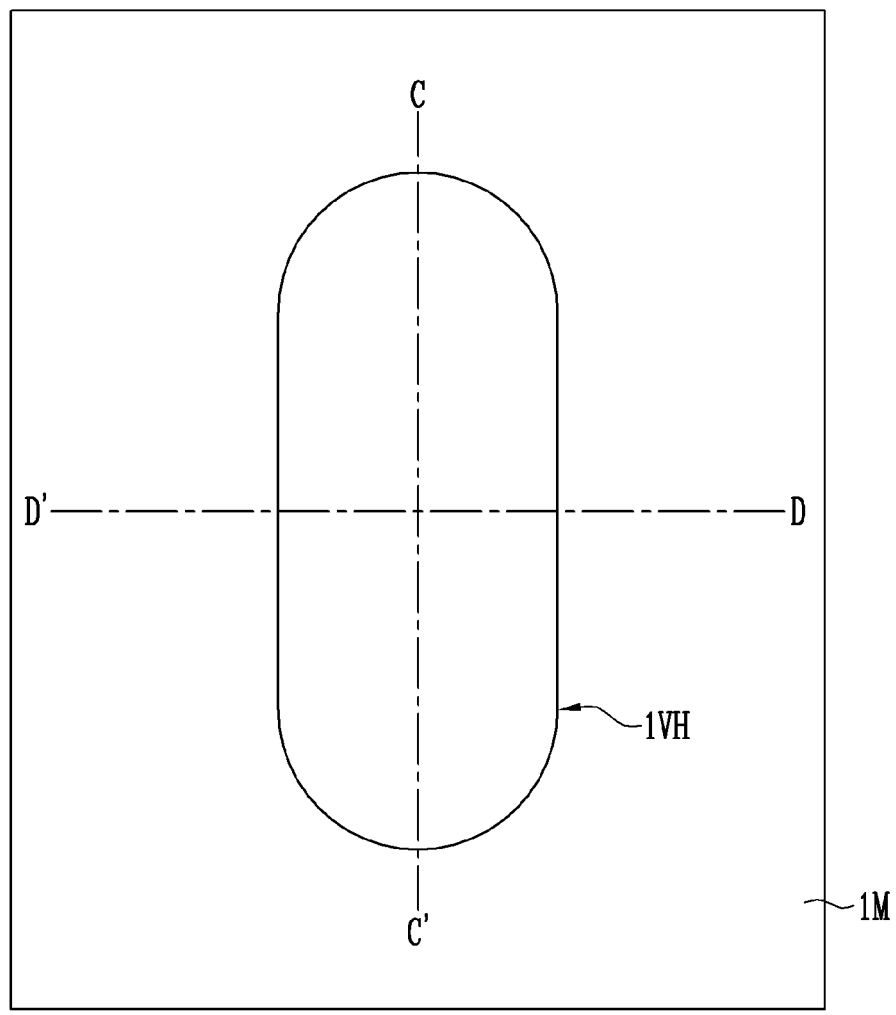
Figure 8D:
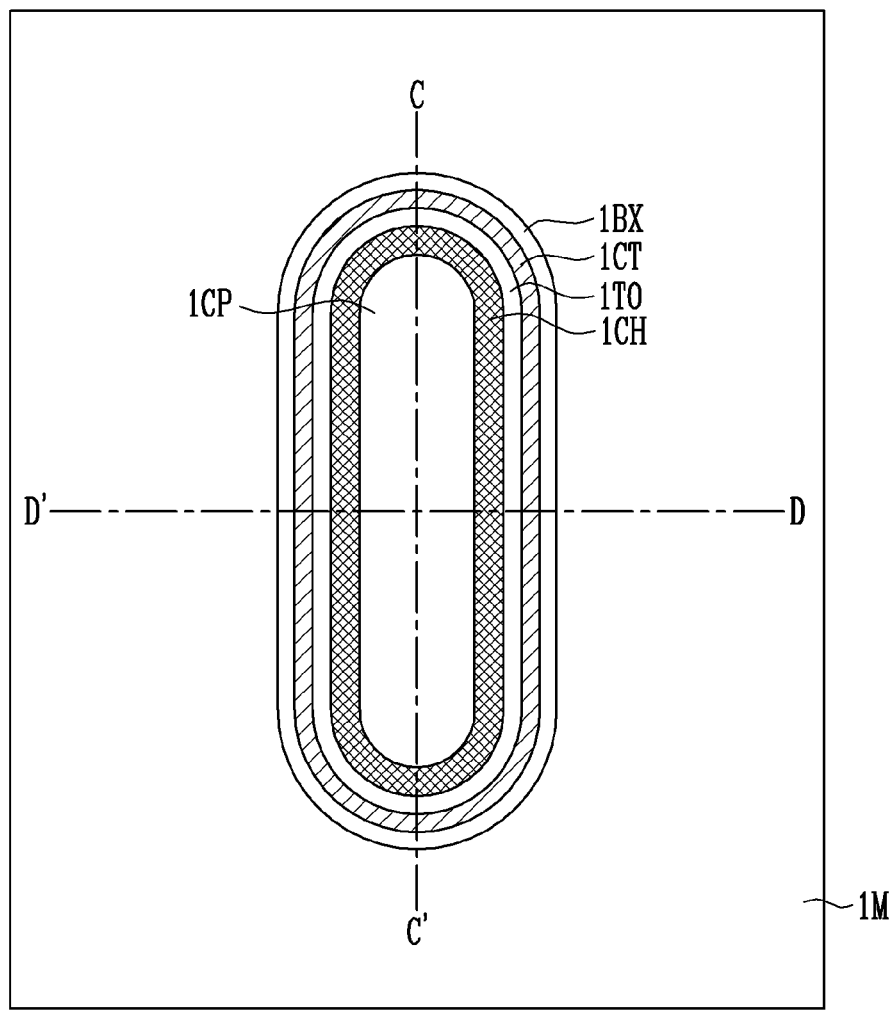
Figure 8E:
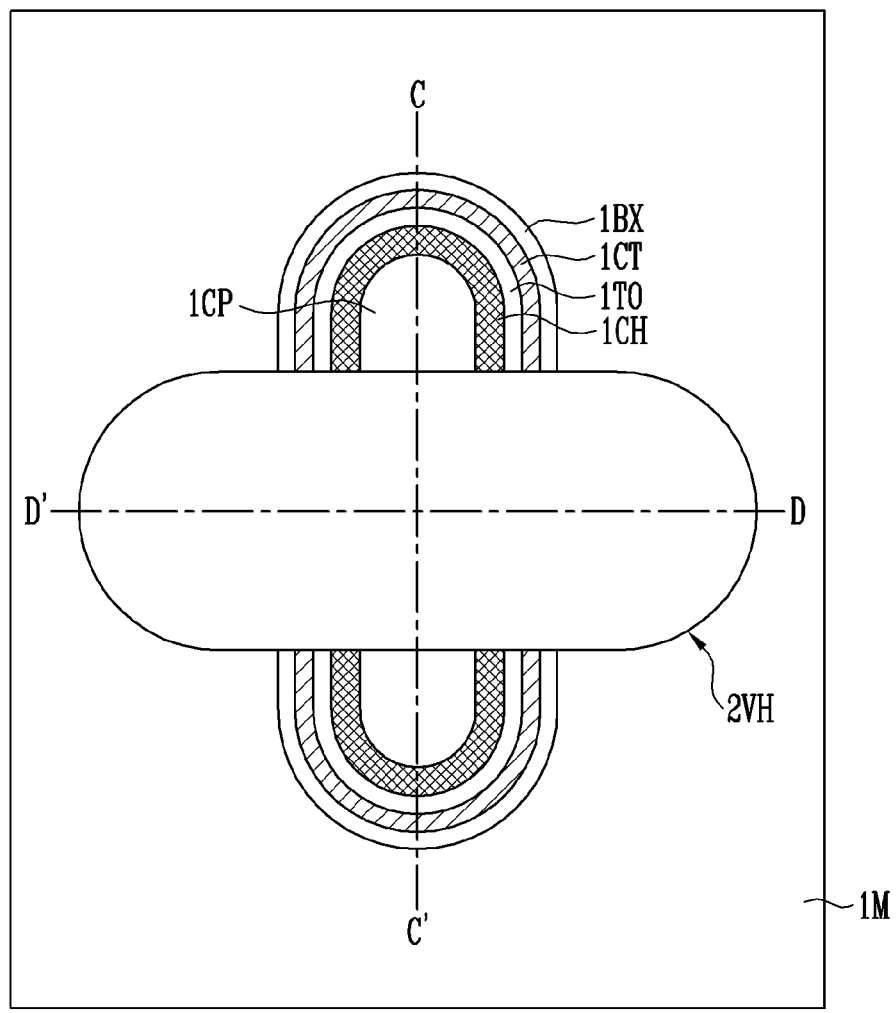
Figure 8F:
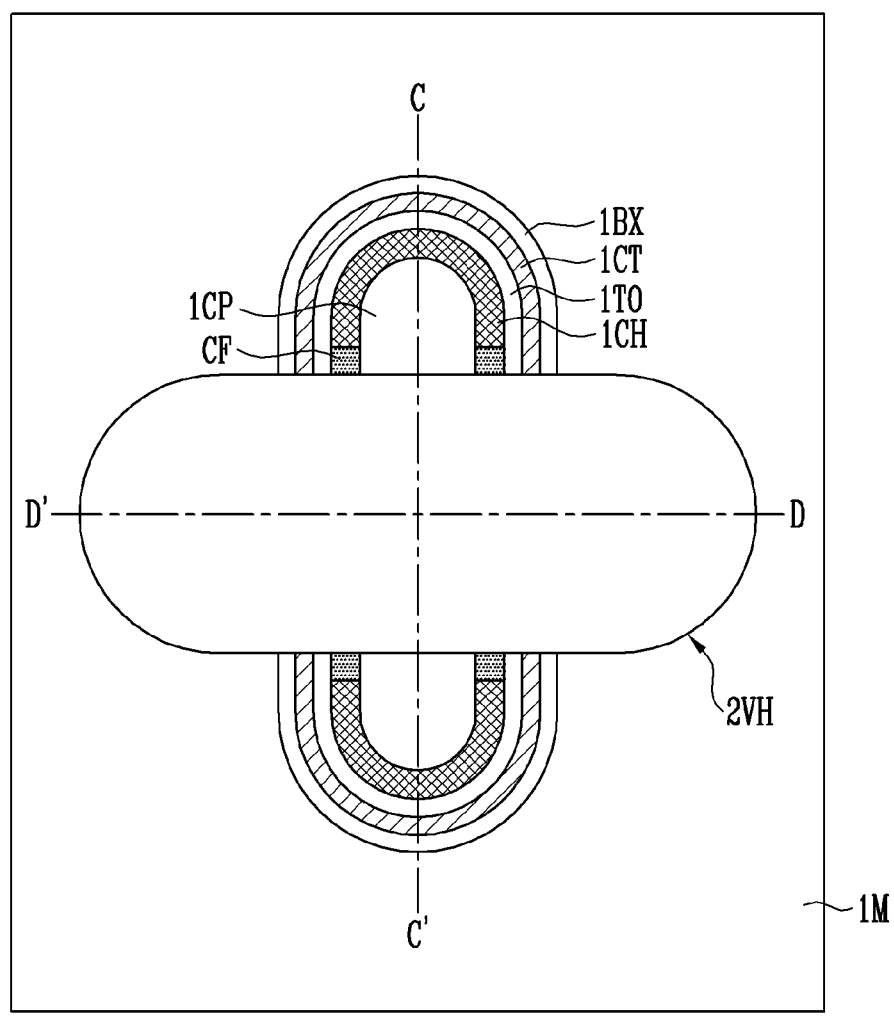
Figure 8G:
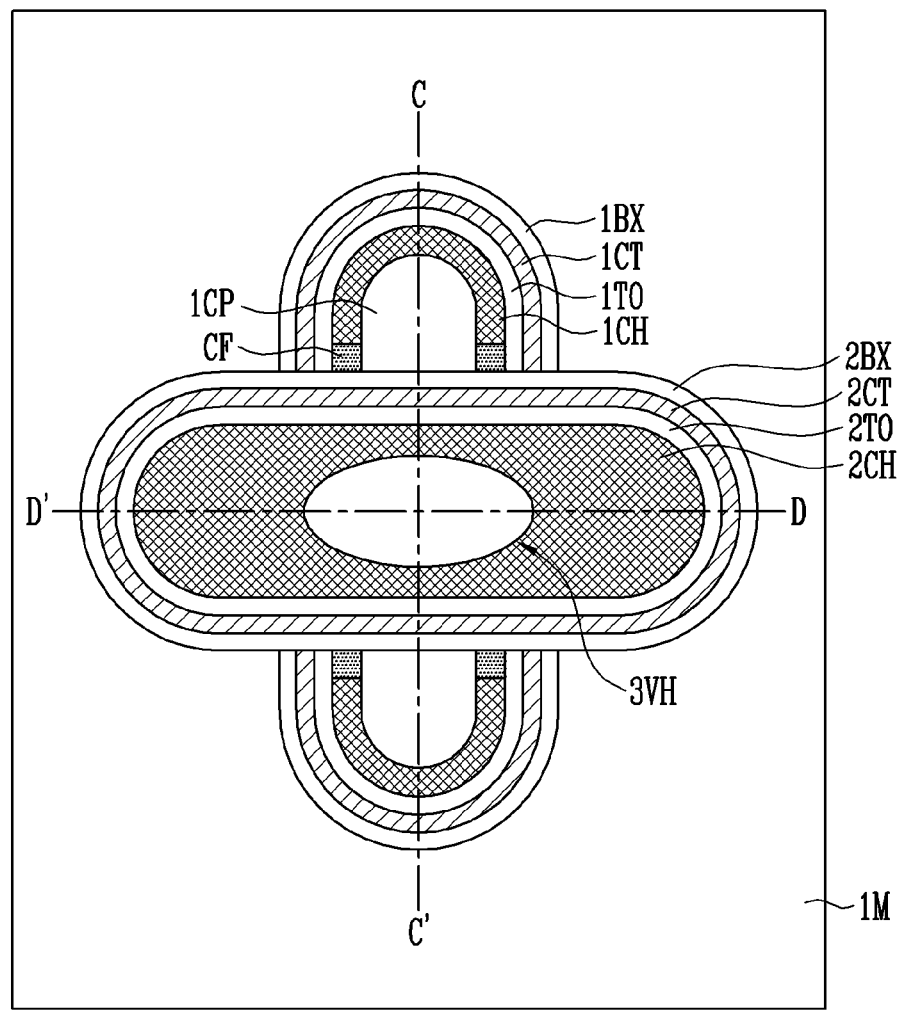
Figure 8H:
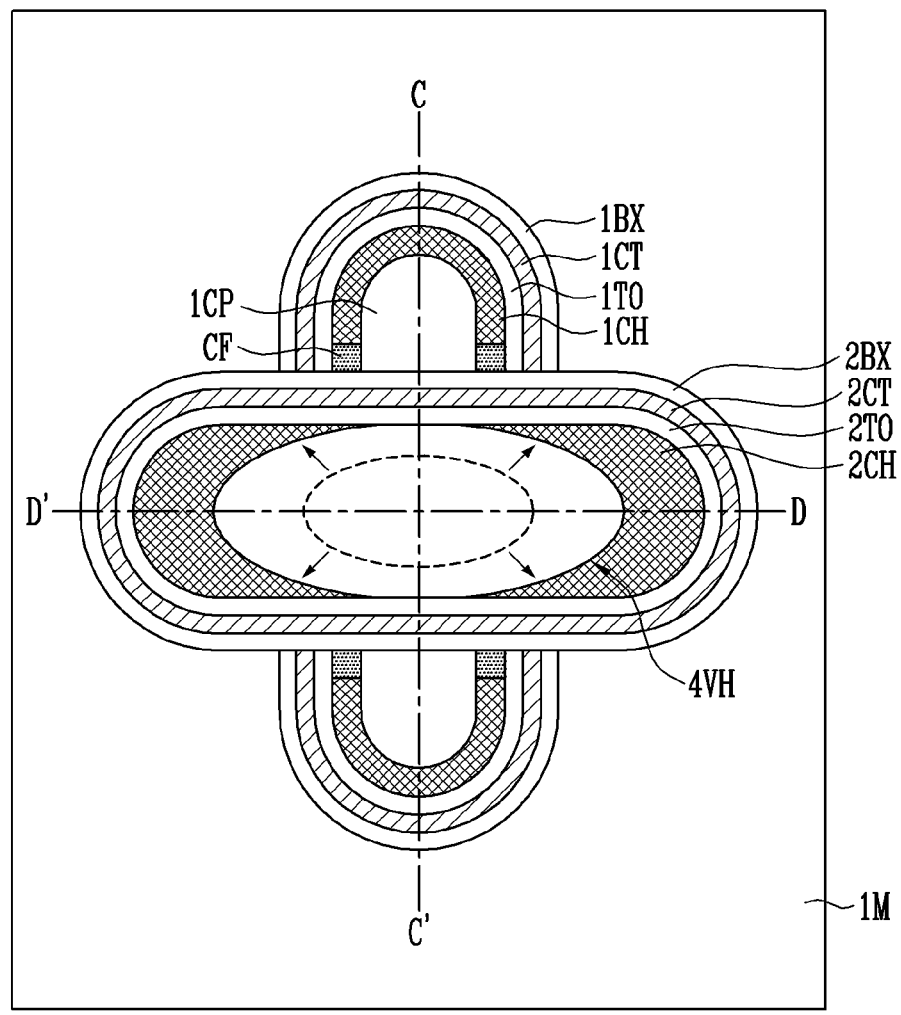
Figure 8I:
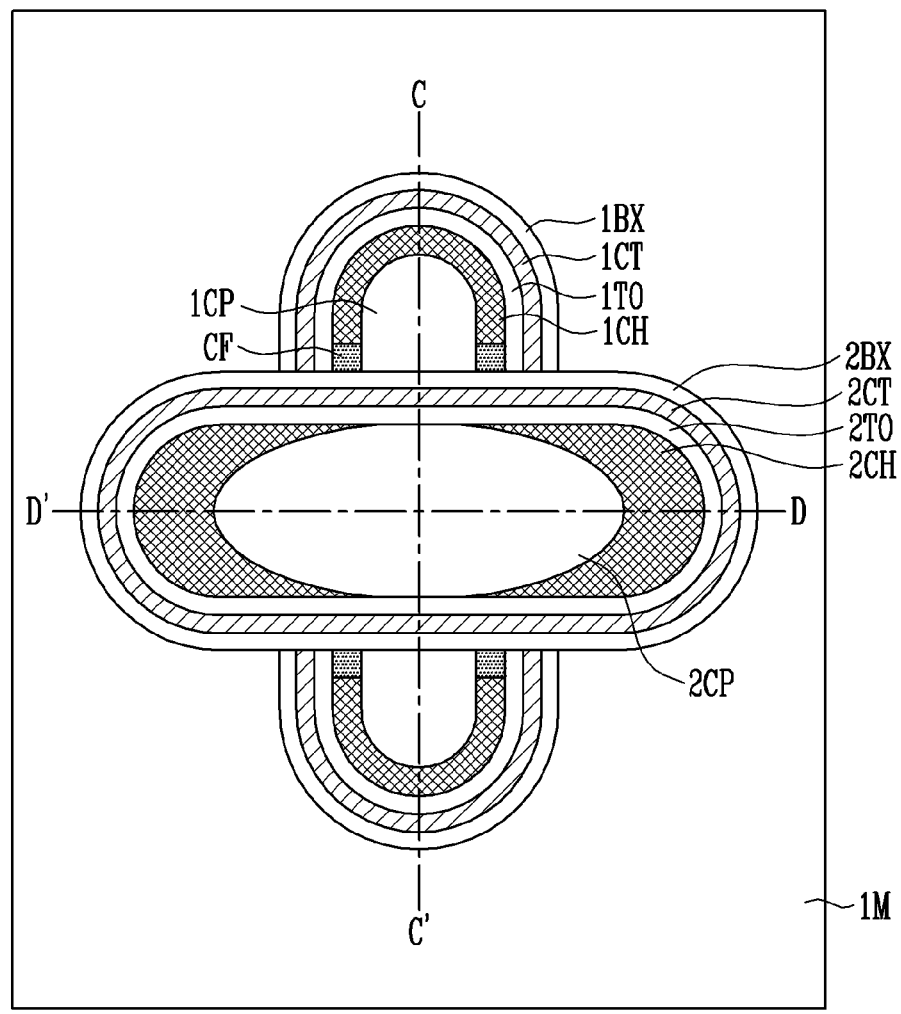
Figure 8J:
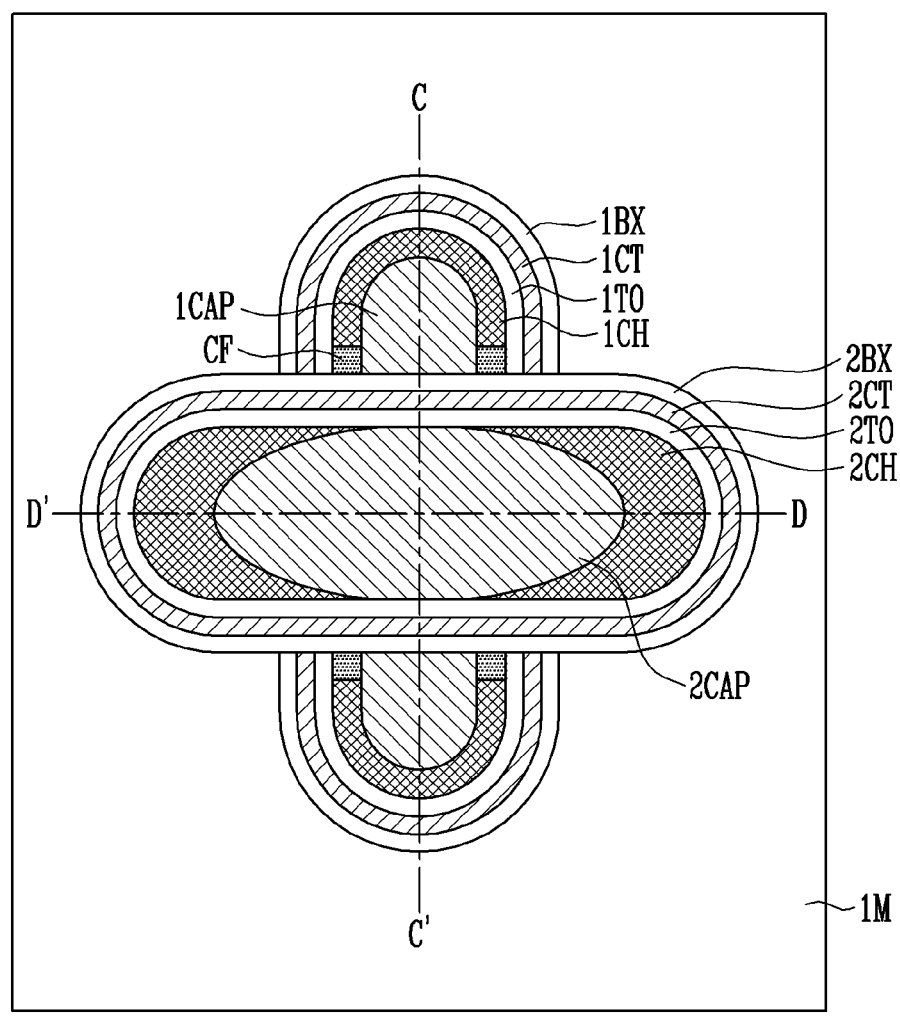
Figure 8K:
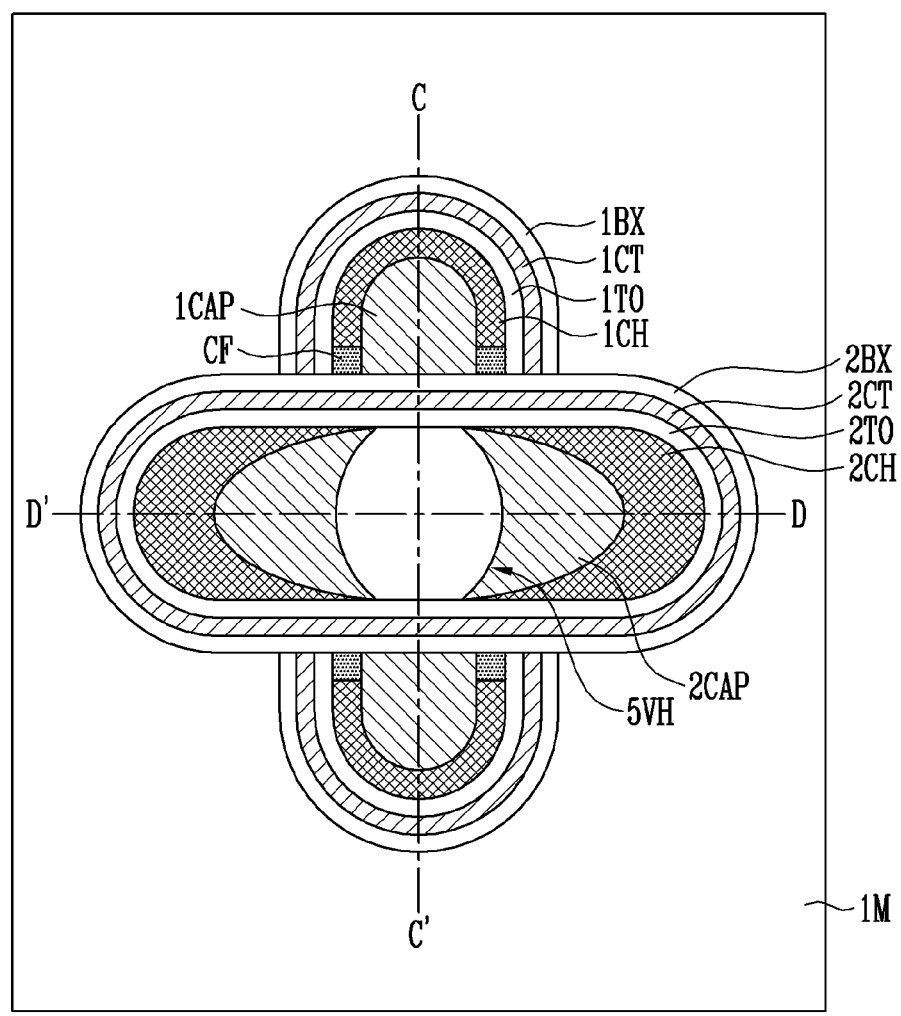
Figure 8L:
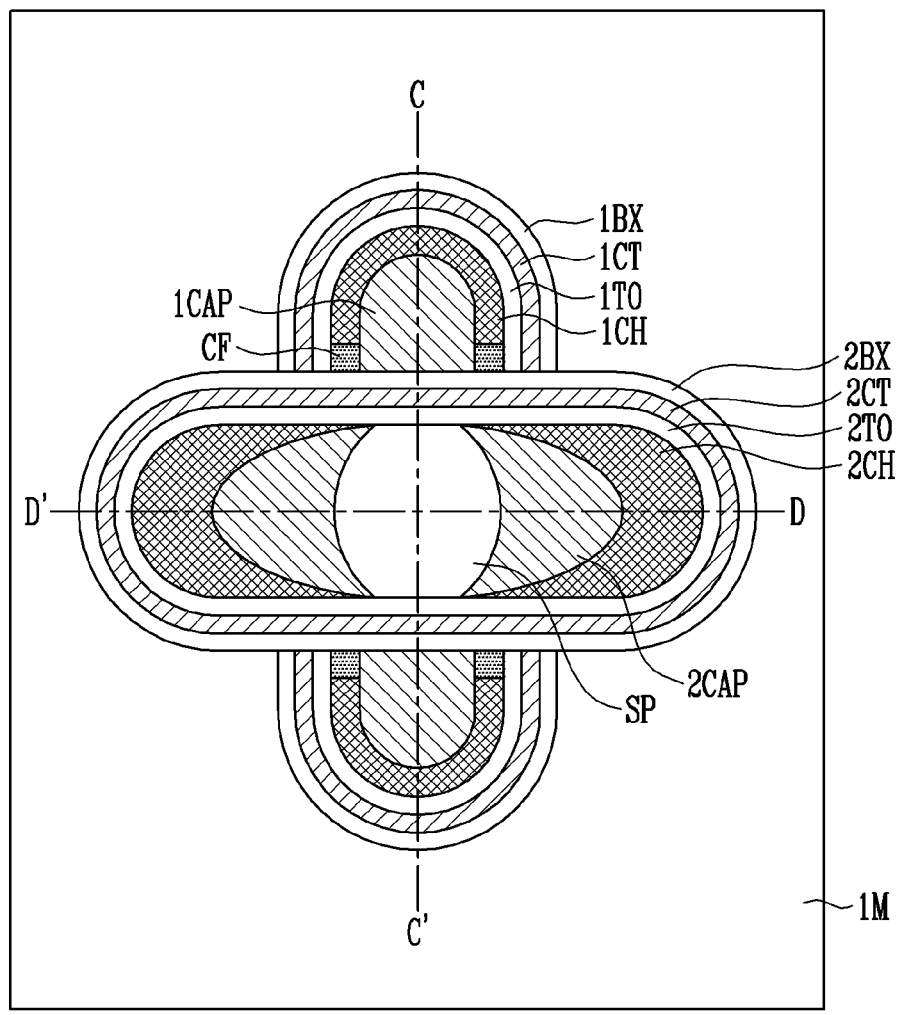
Figure 9A:
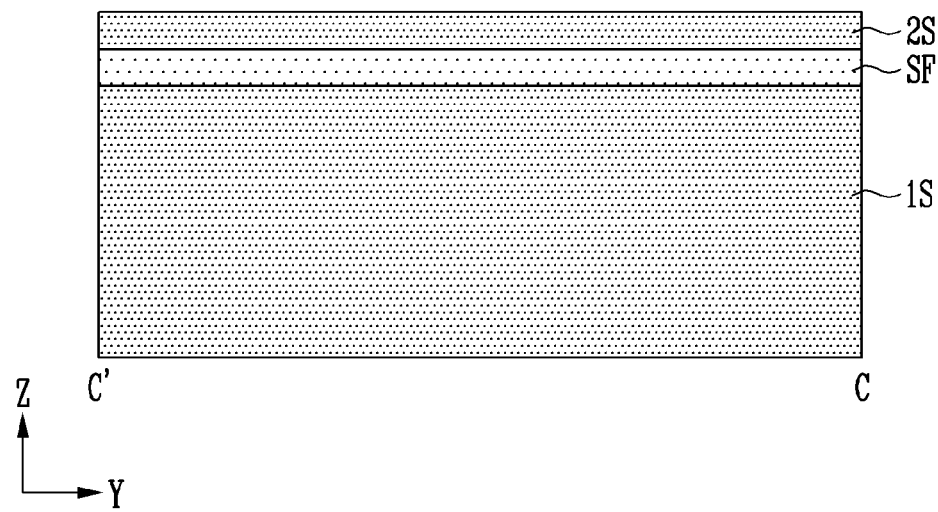
FIGS. 9A, 9B, 9C, 9D, 9E, 9F, 9G, 9H, 9I, 9J, 9K, 9L, 9M, 9N, and 9O are sectional views in a Y-axis direction for describing a method of manufacturing a memory device according to an embodiment of the present disclosure.
Figure 9B:
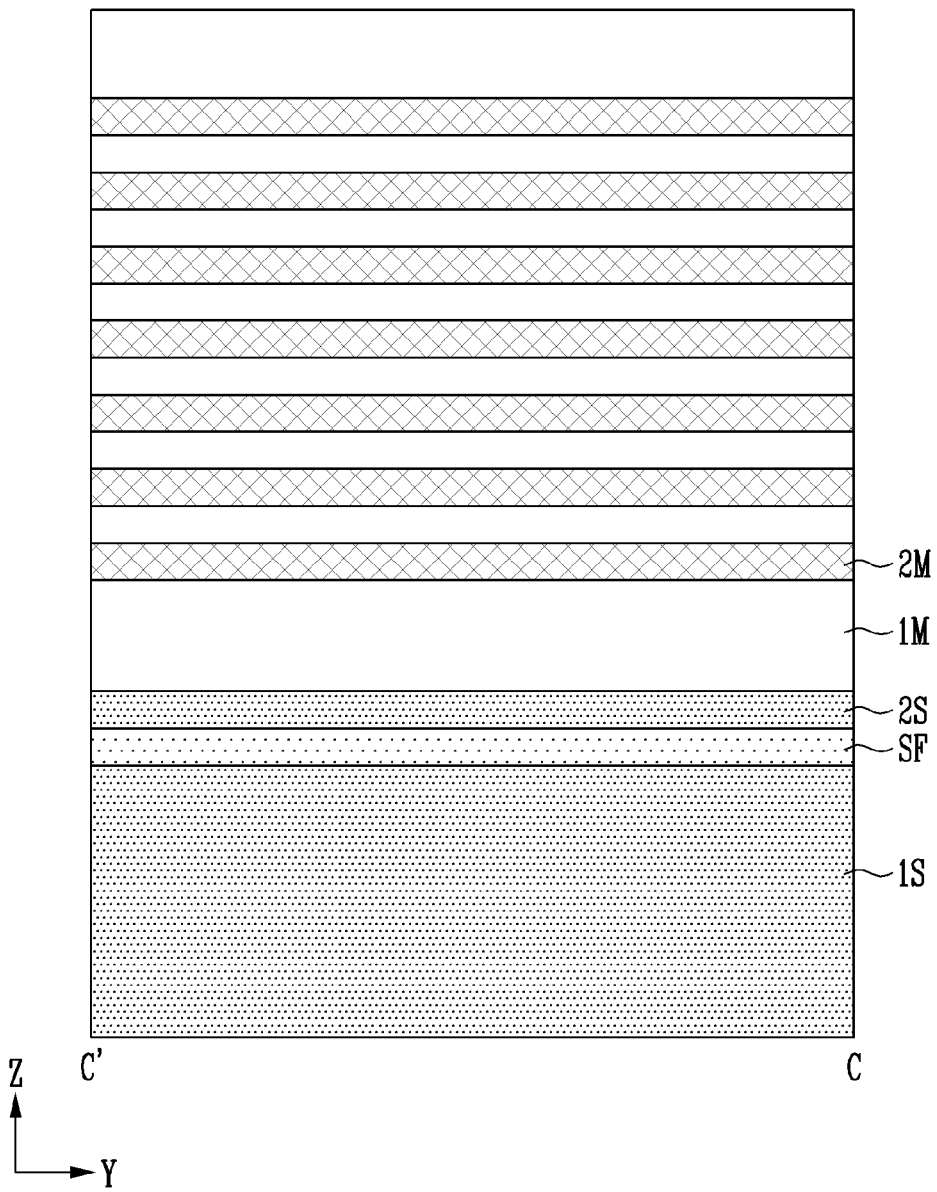
Figure 9C:
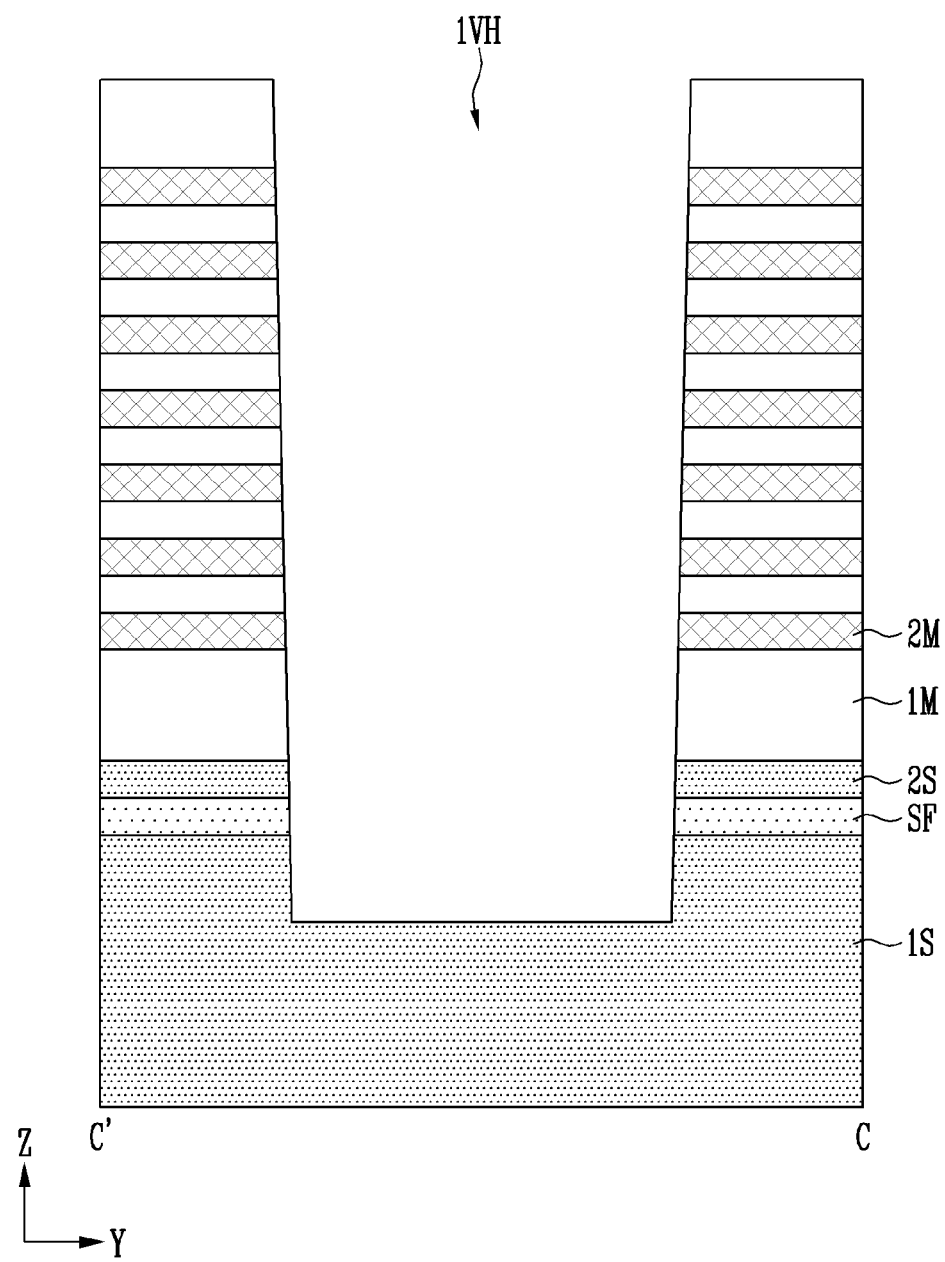
Figure 9D:
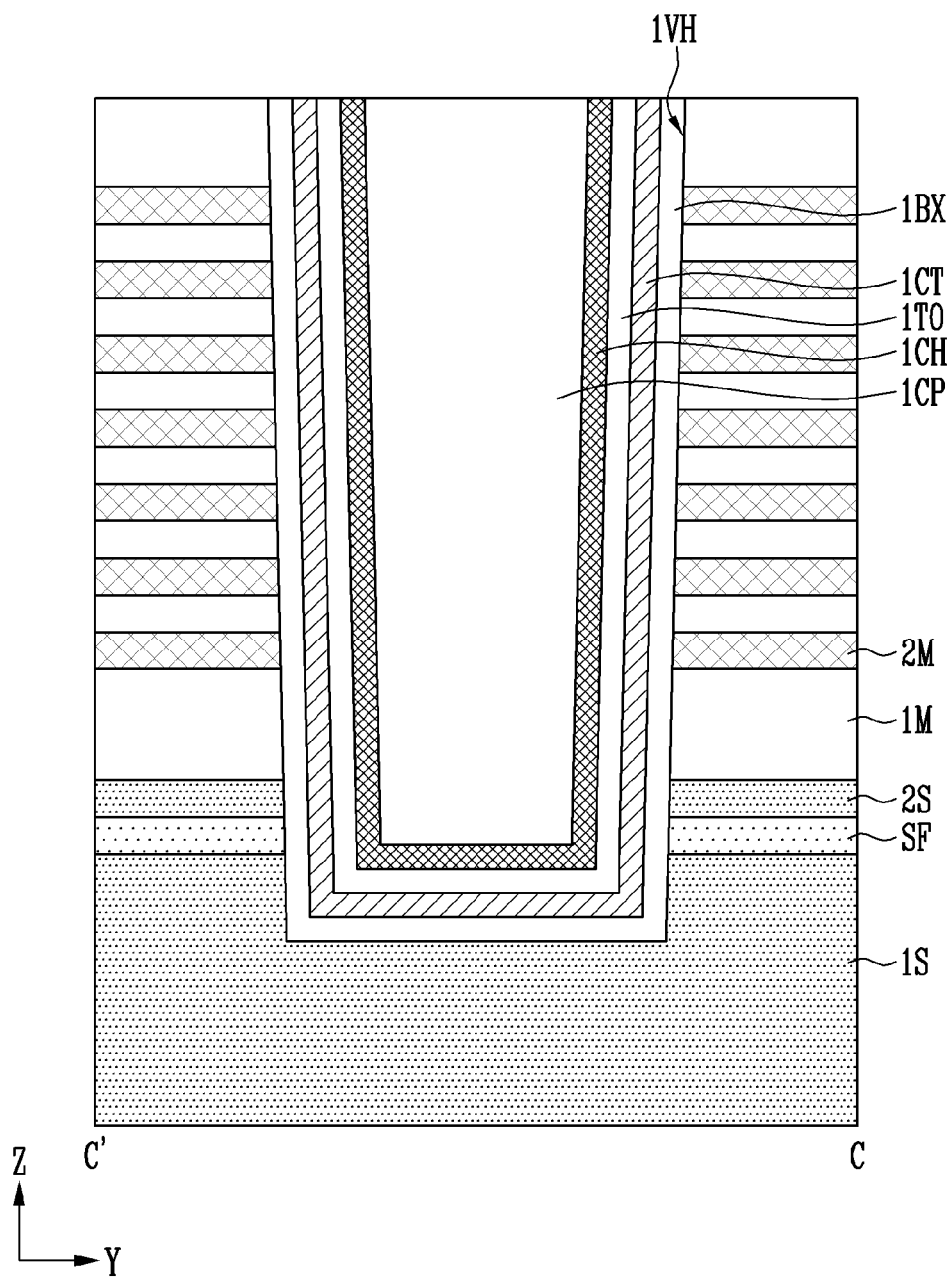
Figure 9E:
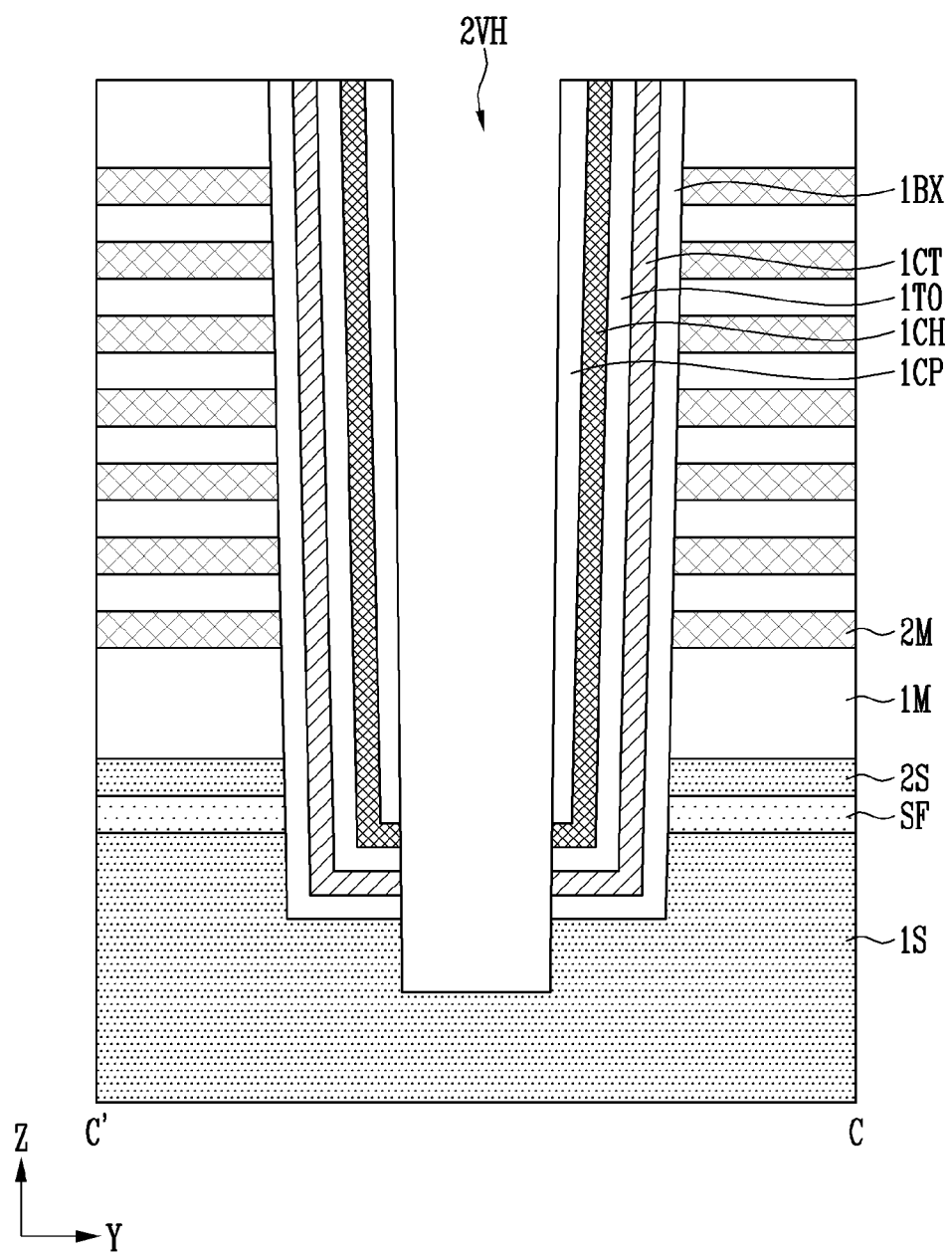
Figure 9F:
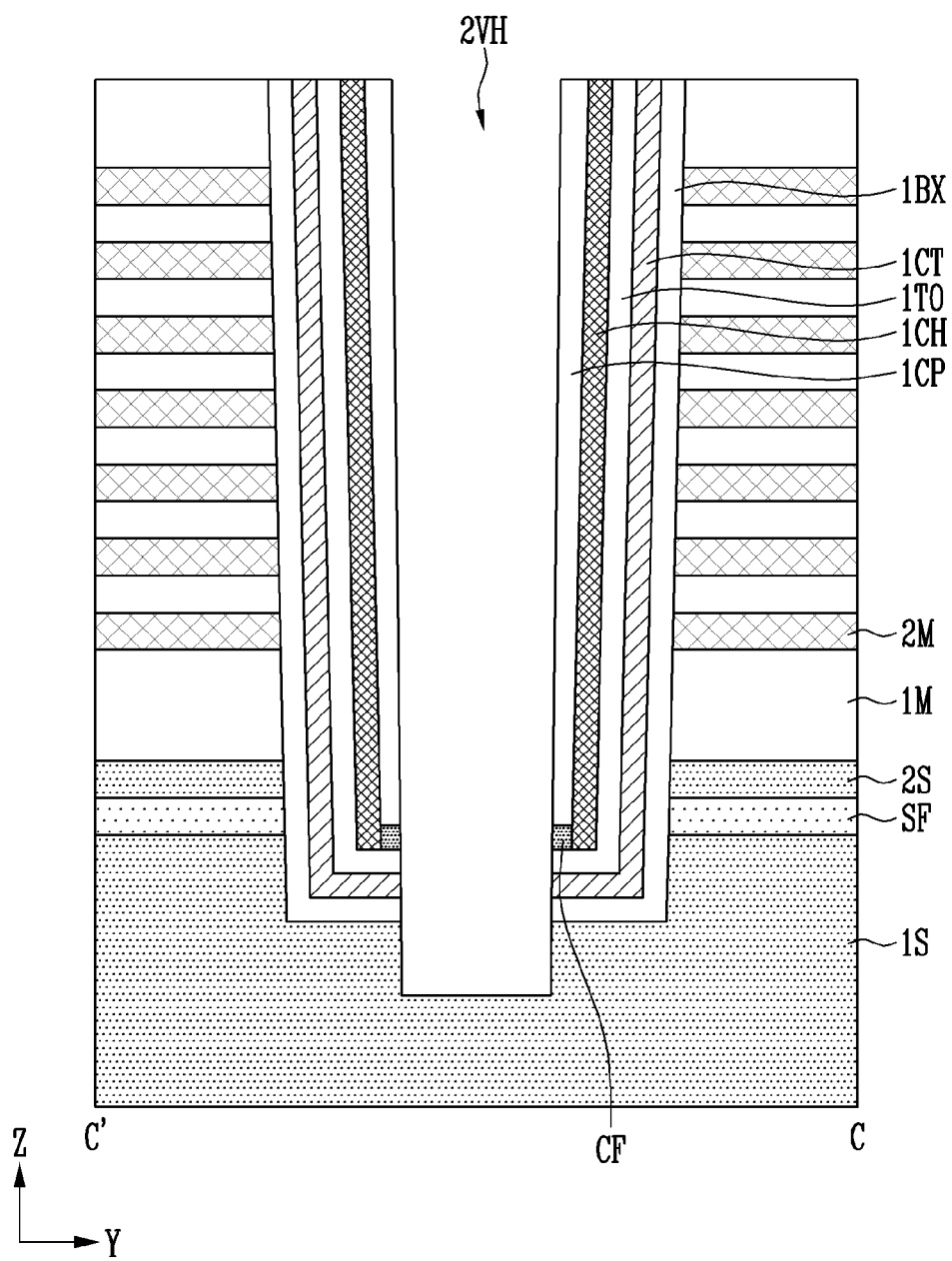
Figure 9G:
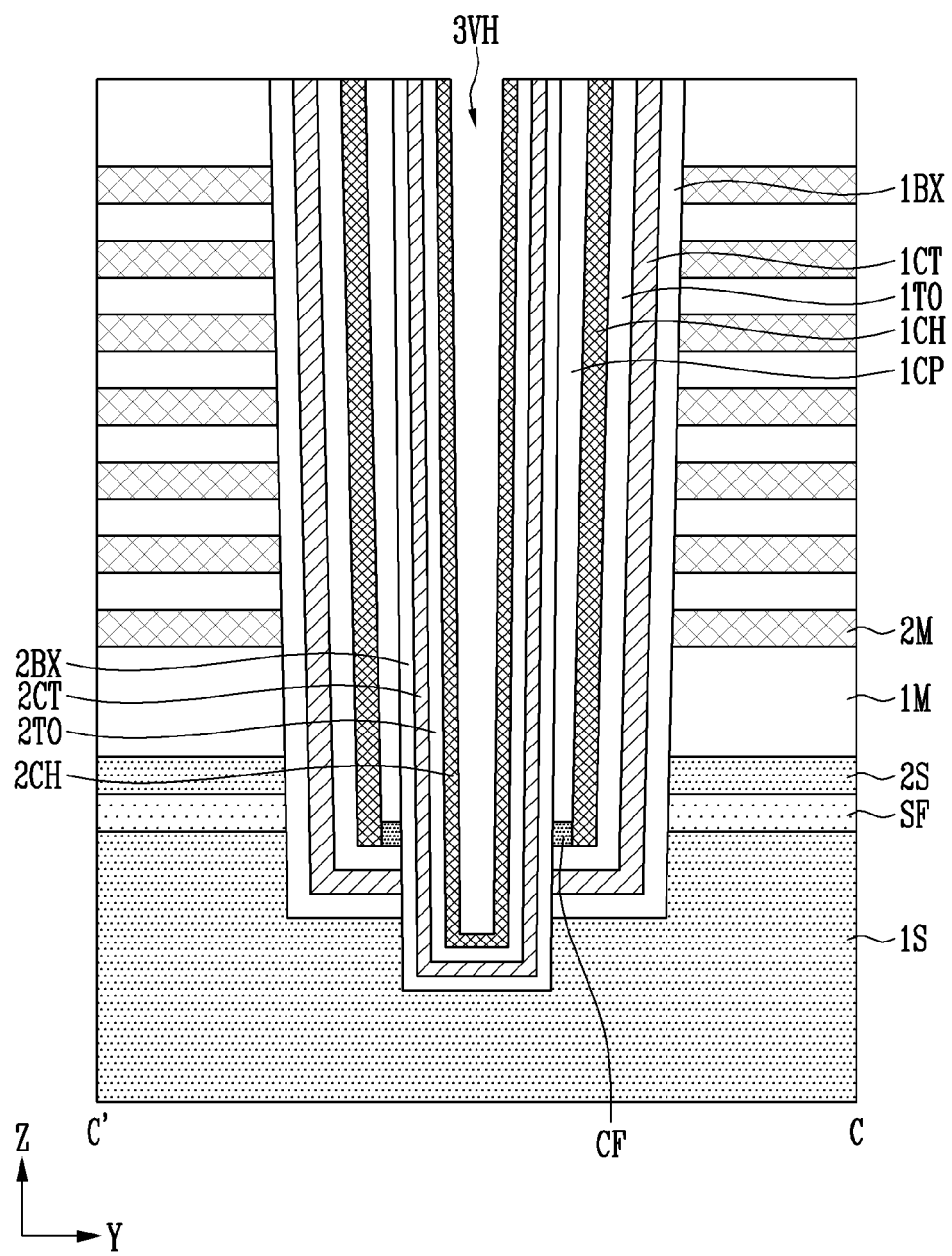
Figure 9H:
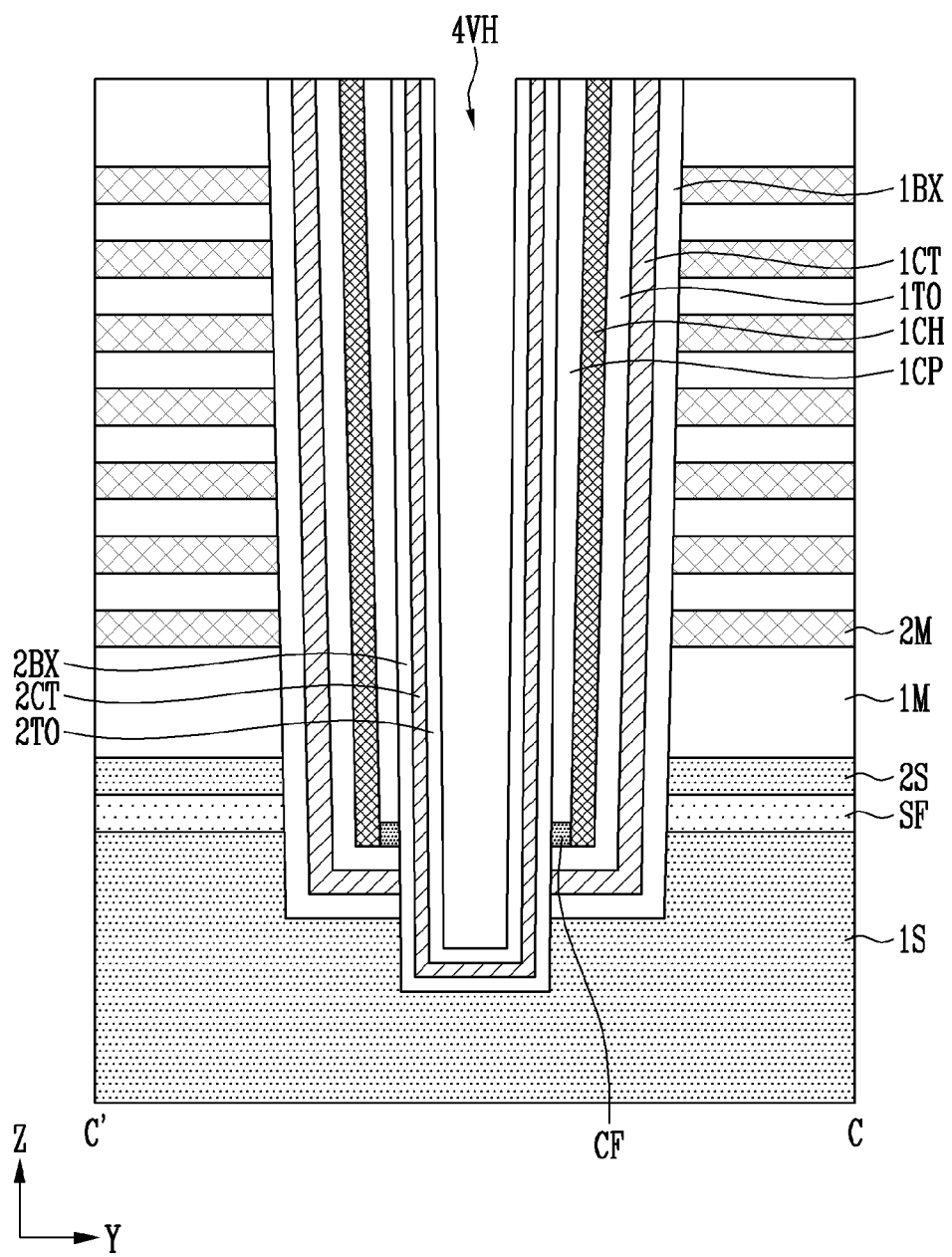
Figure 9I:
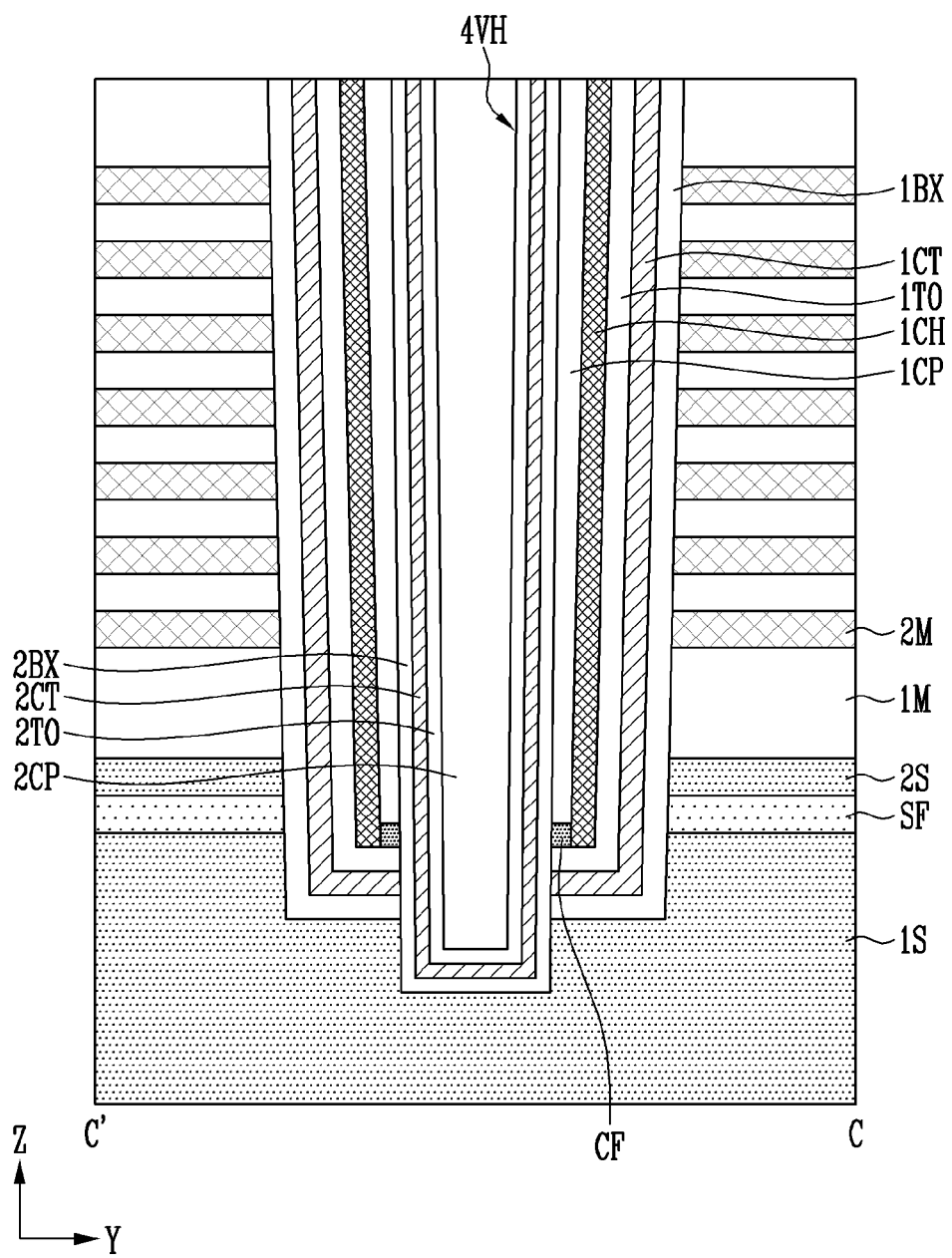
Figure 9J:
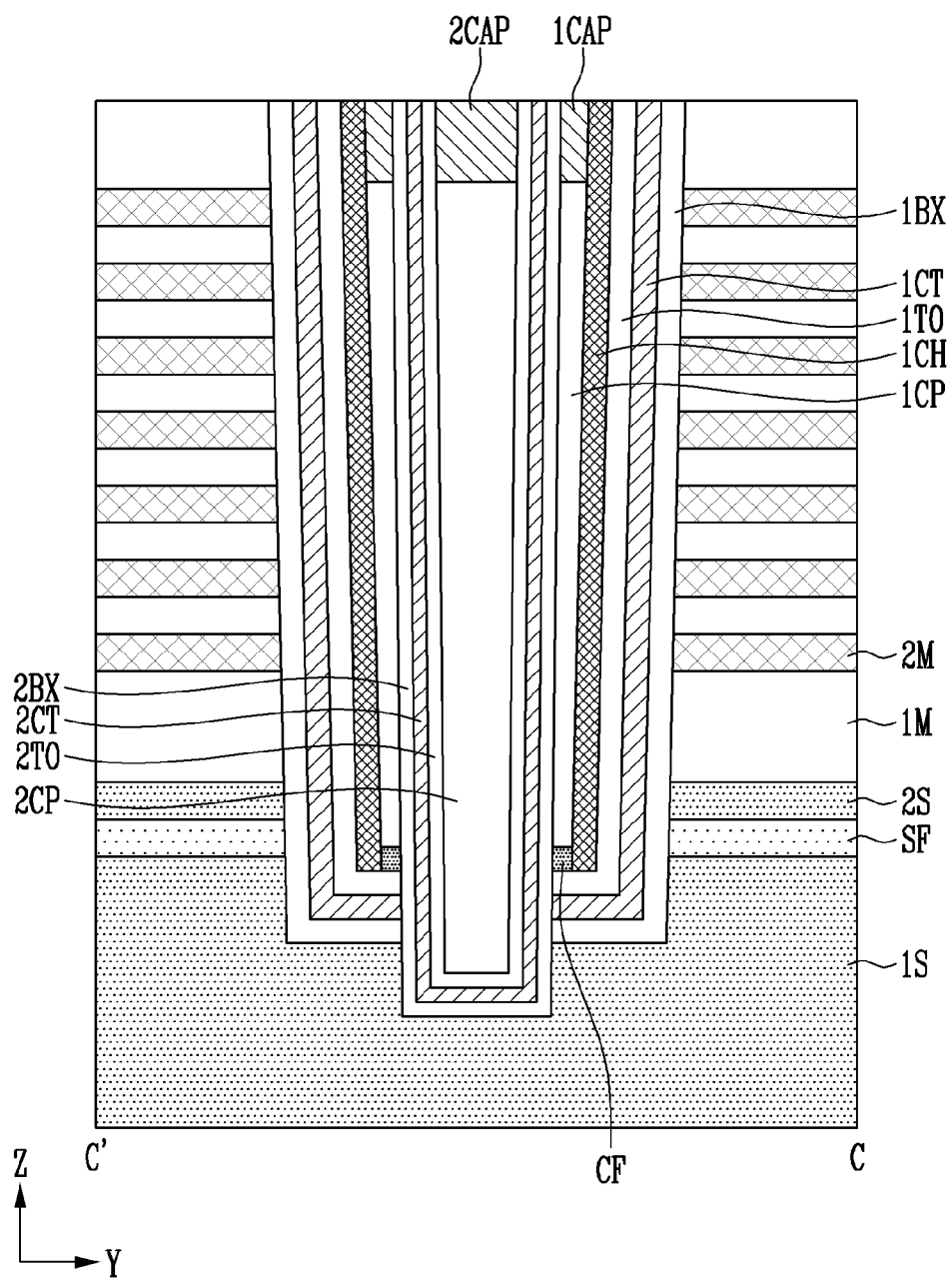
Figure 9K:
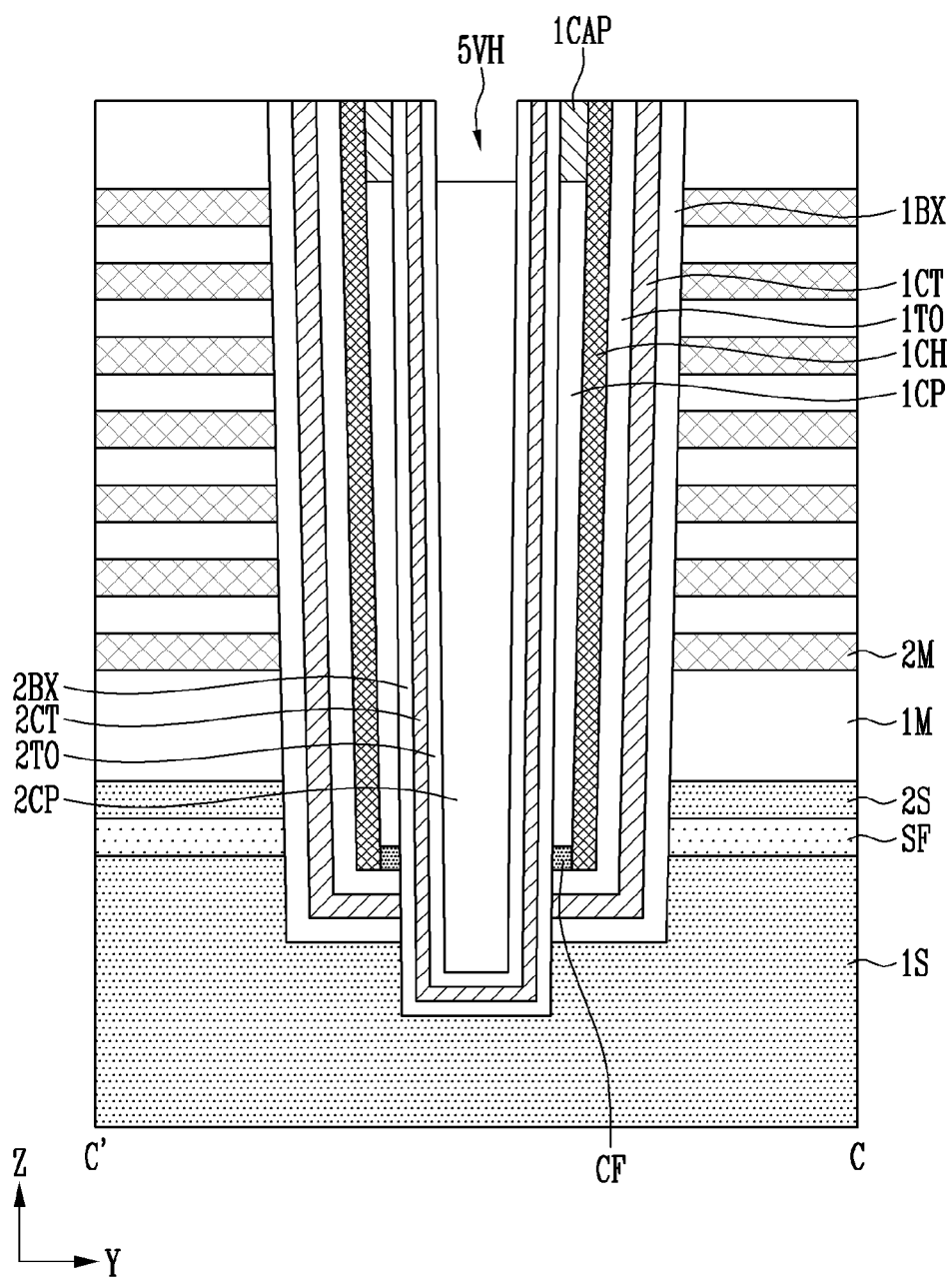
Figure 9L:
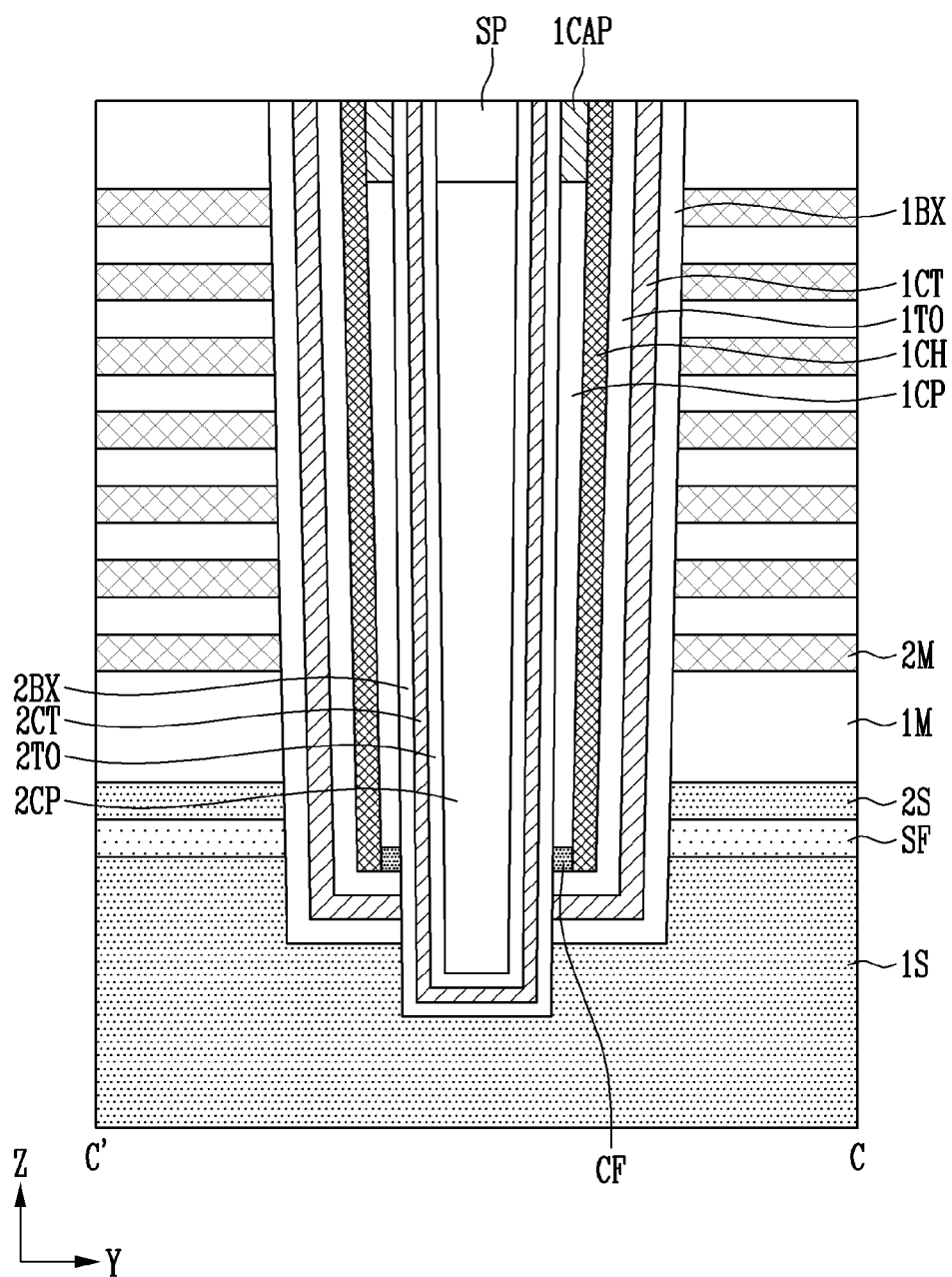
Figure 9M:
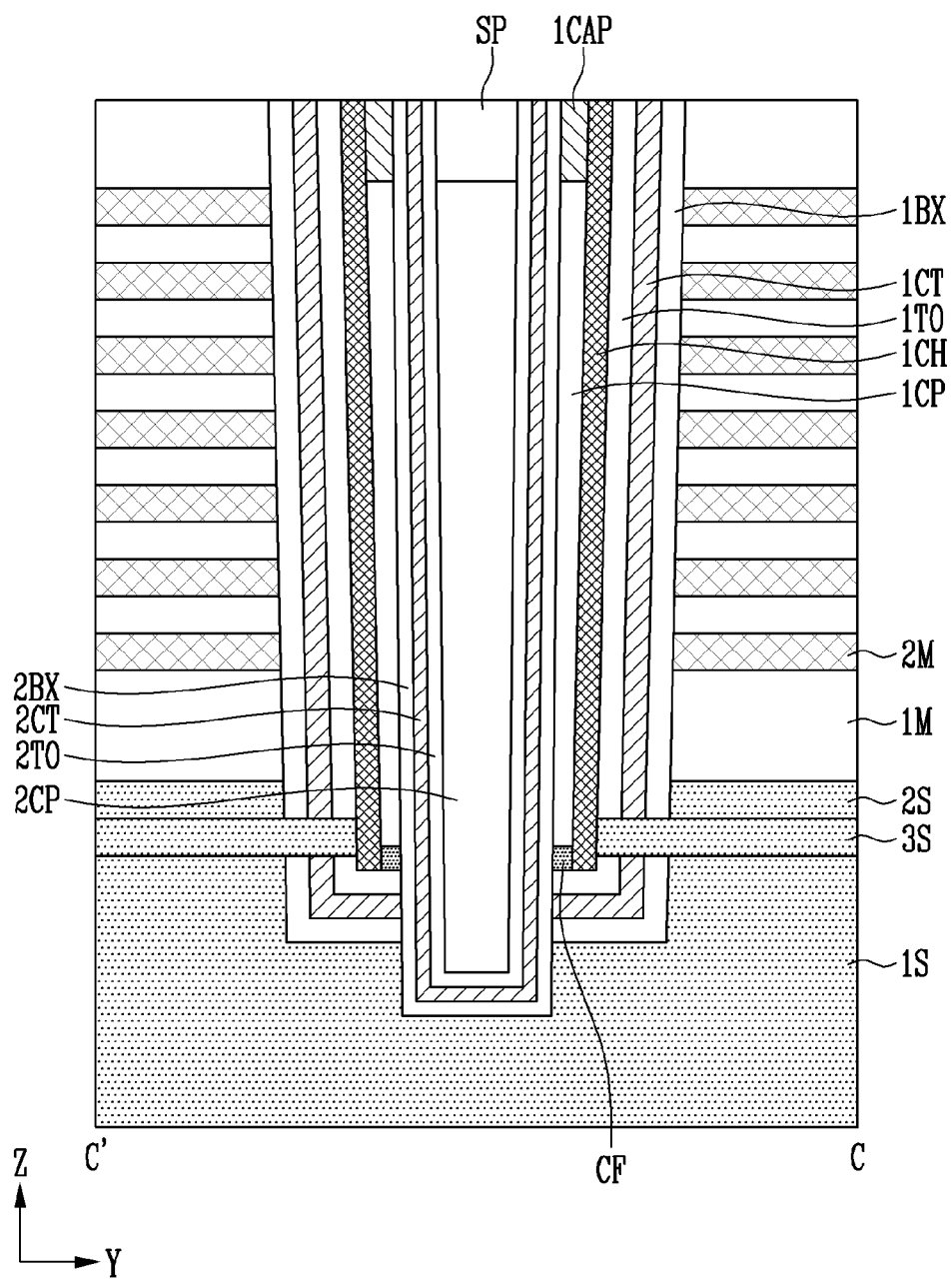
Figure 9N:
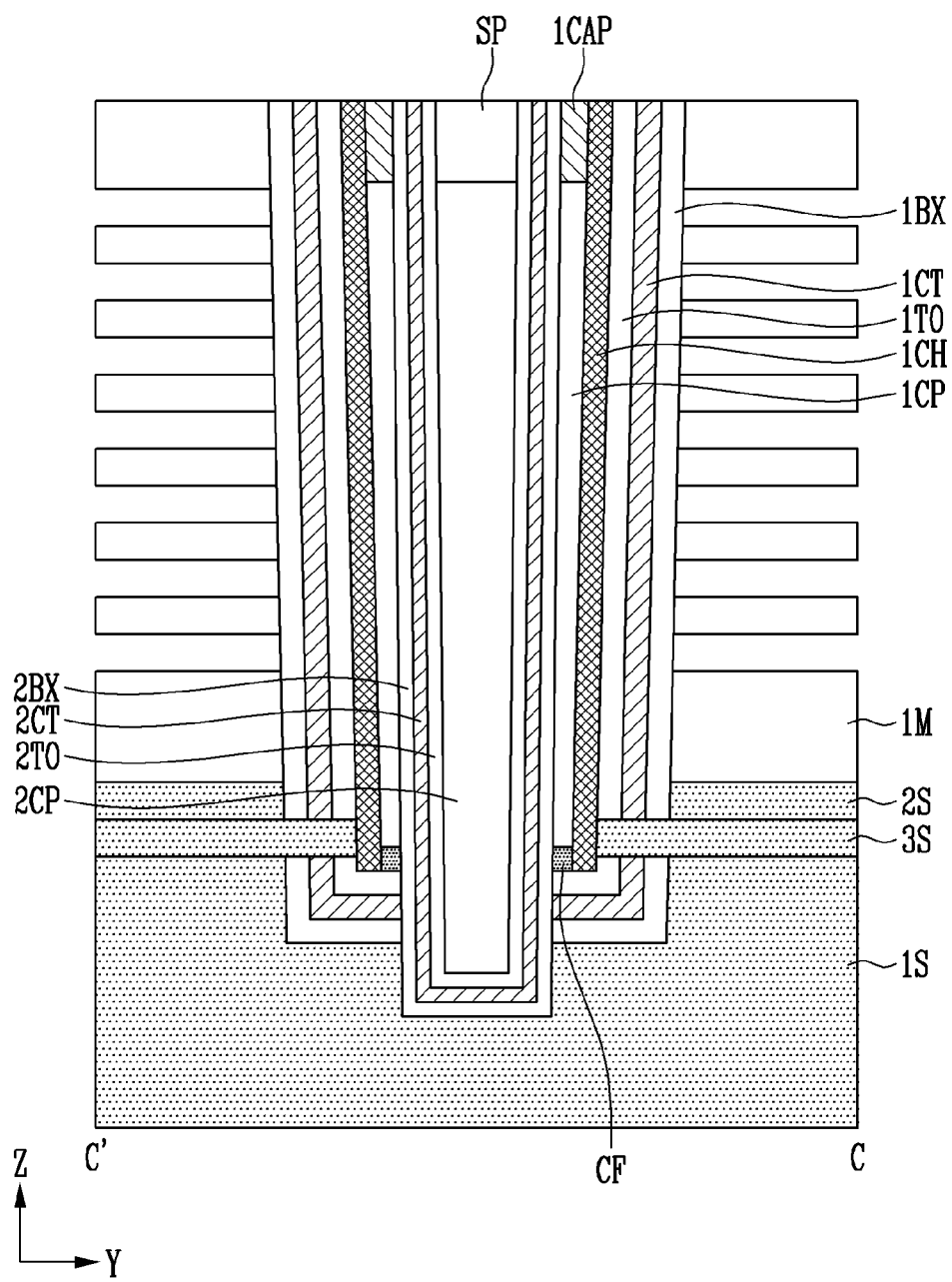
Figure 9O:
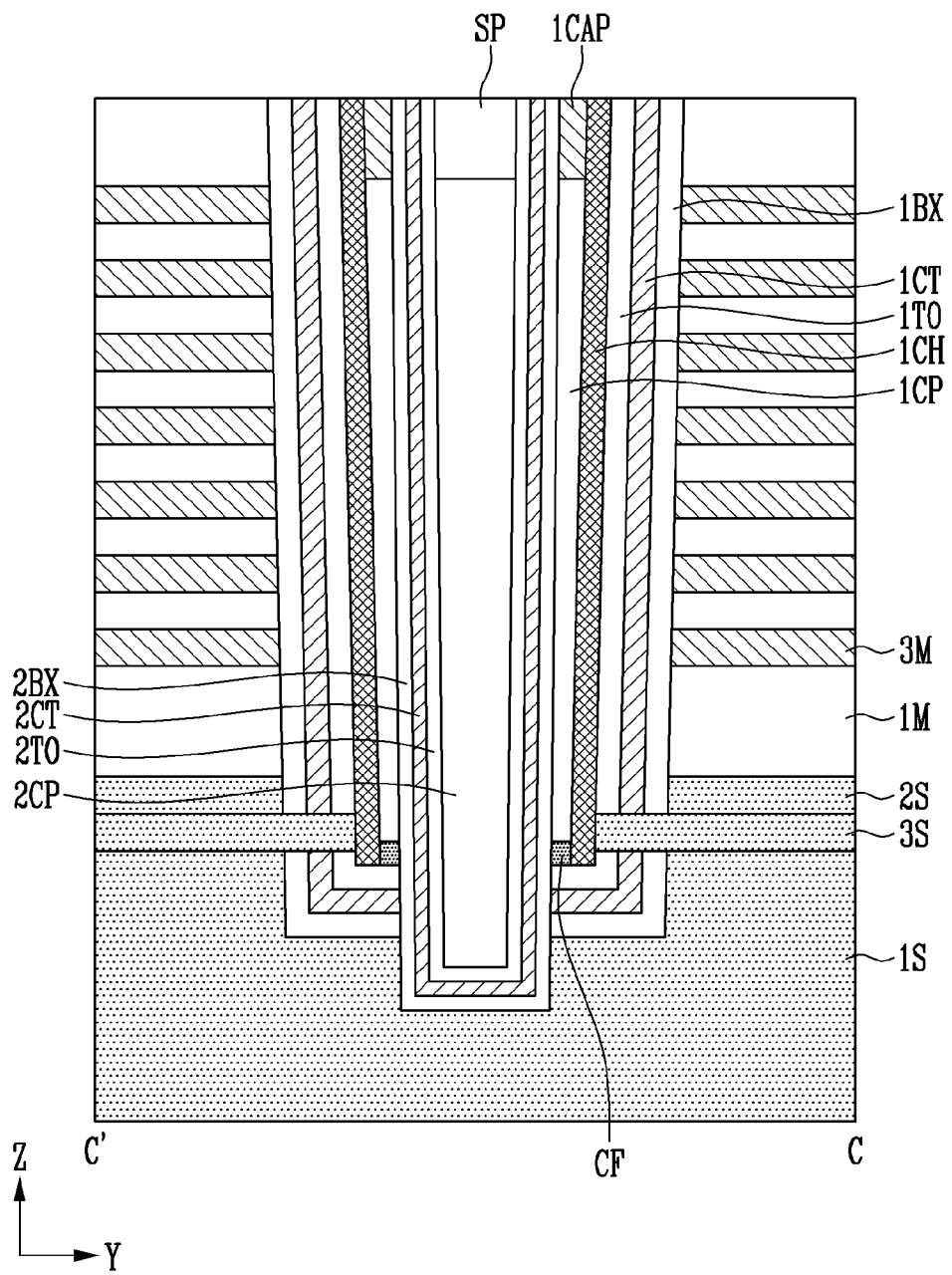
Figure 10A:
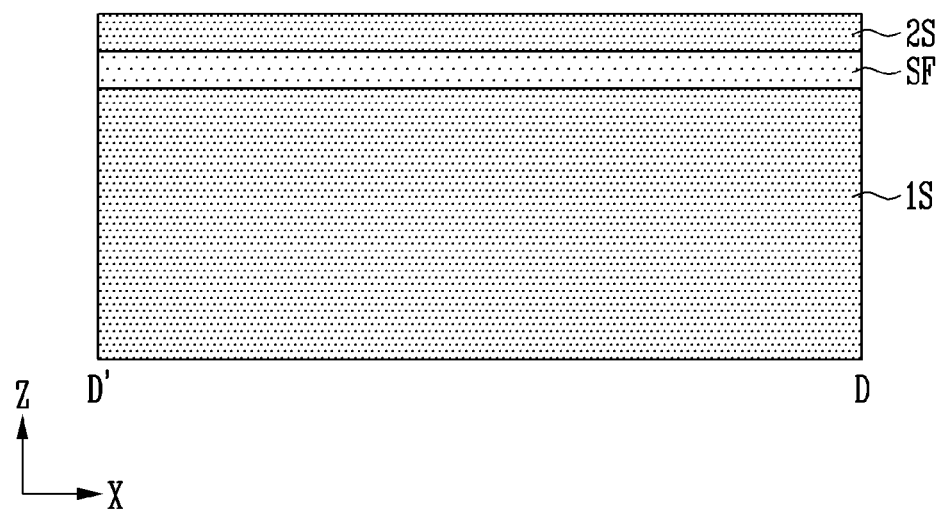
FIGS. 10A, 10B, 10C, 10D, 10E, 10F, 10G, 10H, 10I, 10J, 10K, 10L, 10M, 10N, and 10O are sectional views in an X-axis direction for describing a method of manufacturing a memory device according to an embodiment of the present disclosure.
Figure 10B:
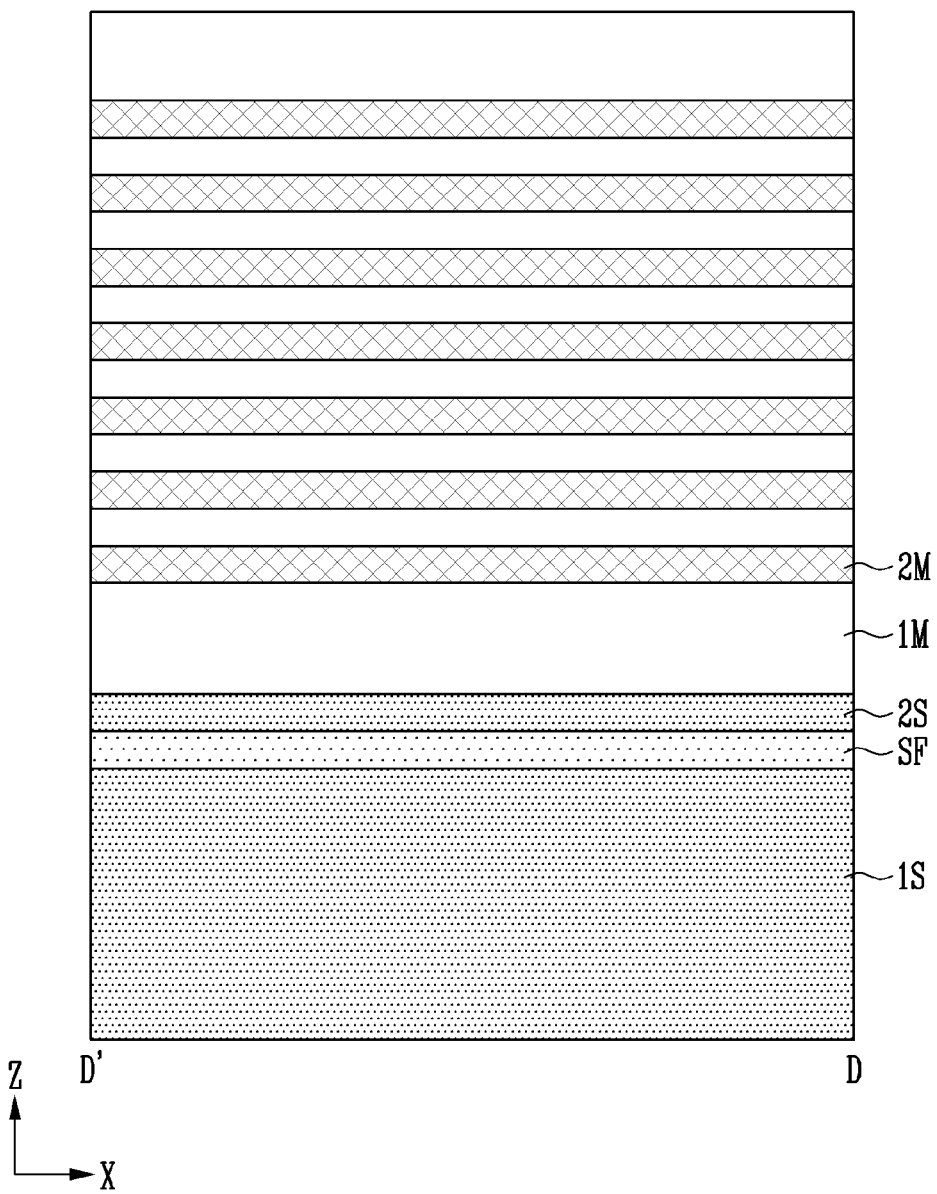
Figure 10C:
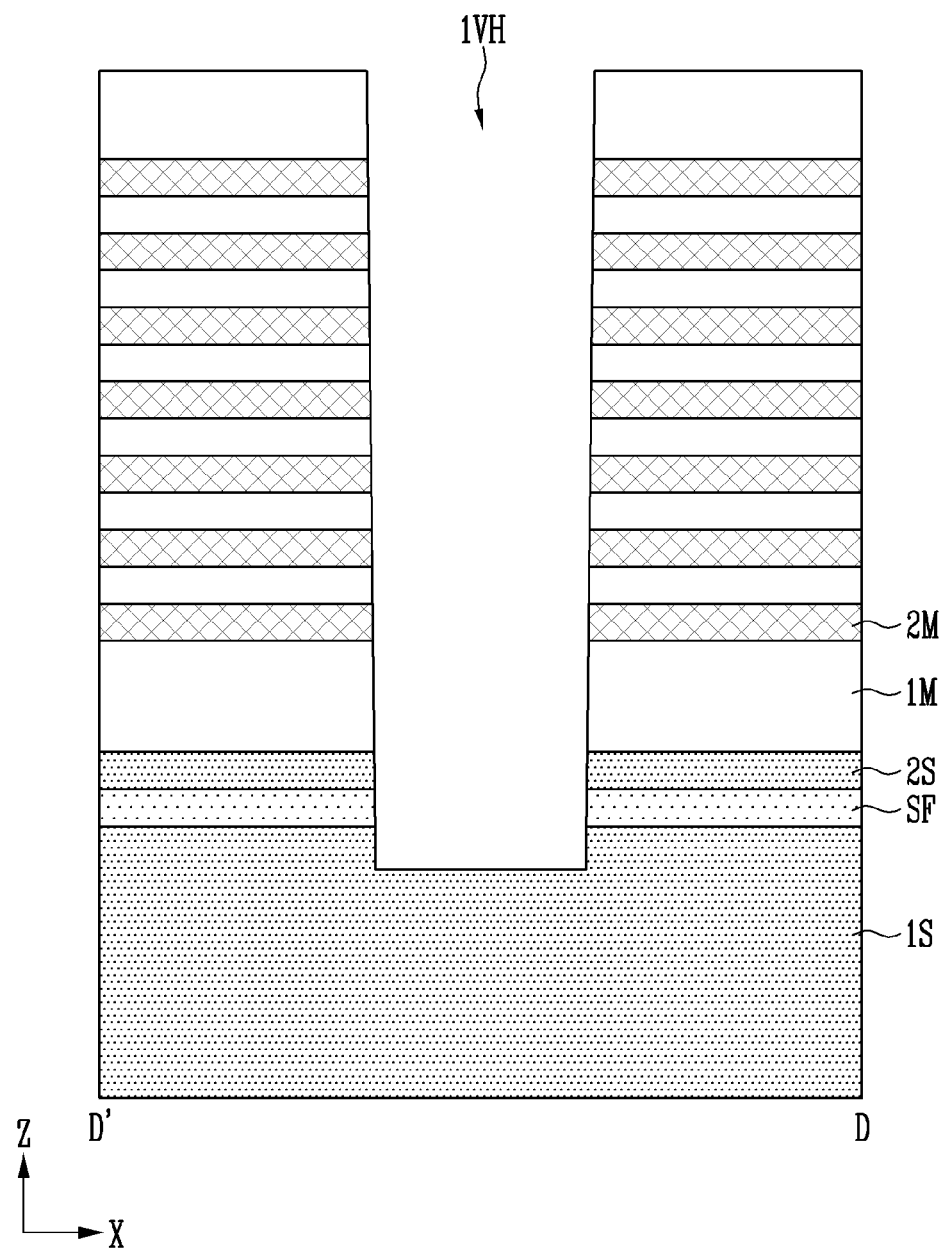
Figure 10D:
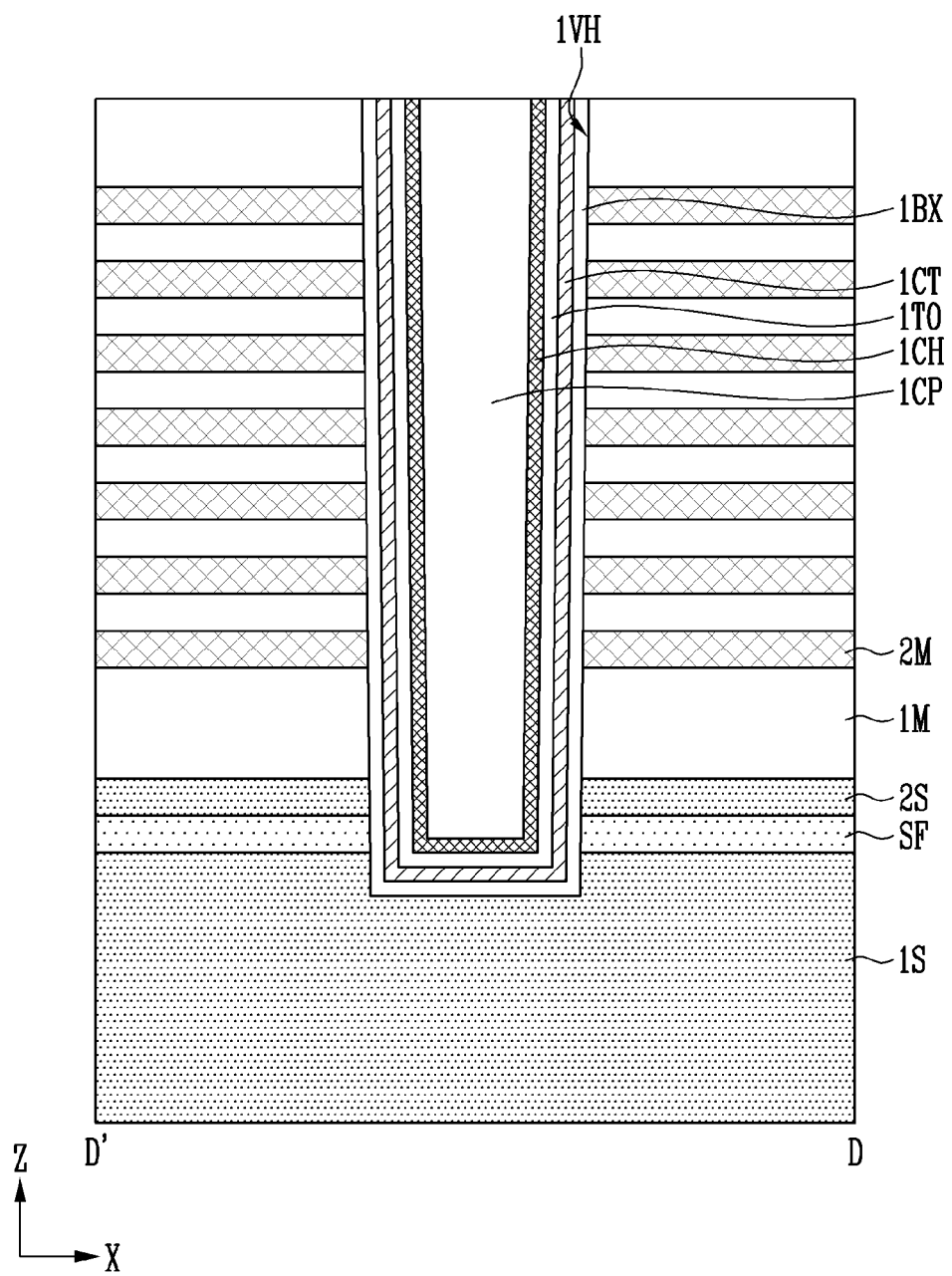
Figure 10E:
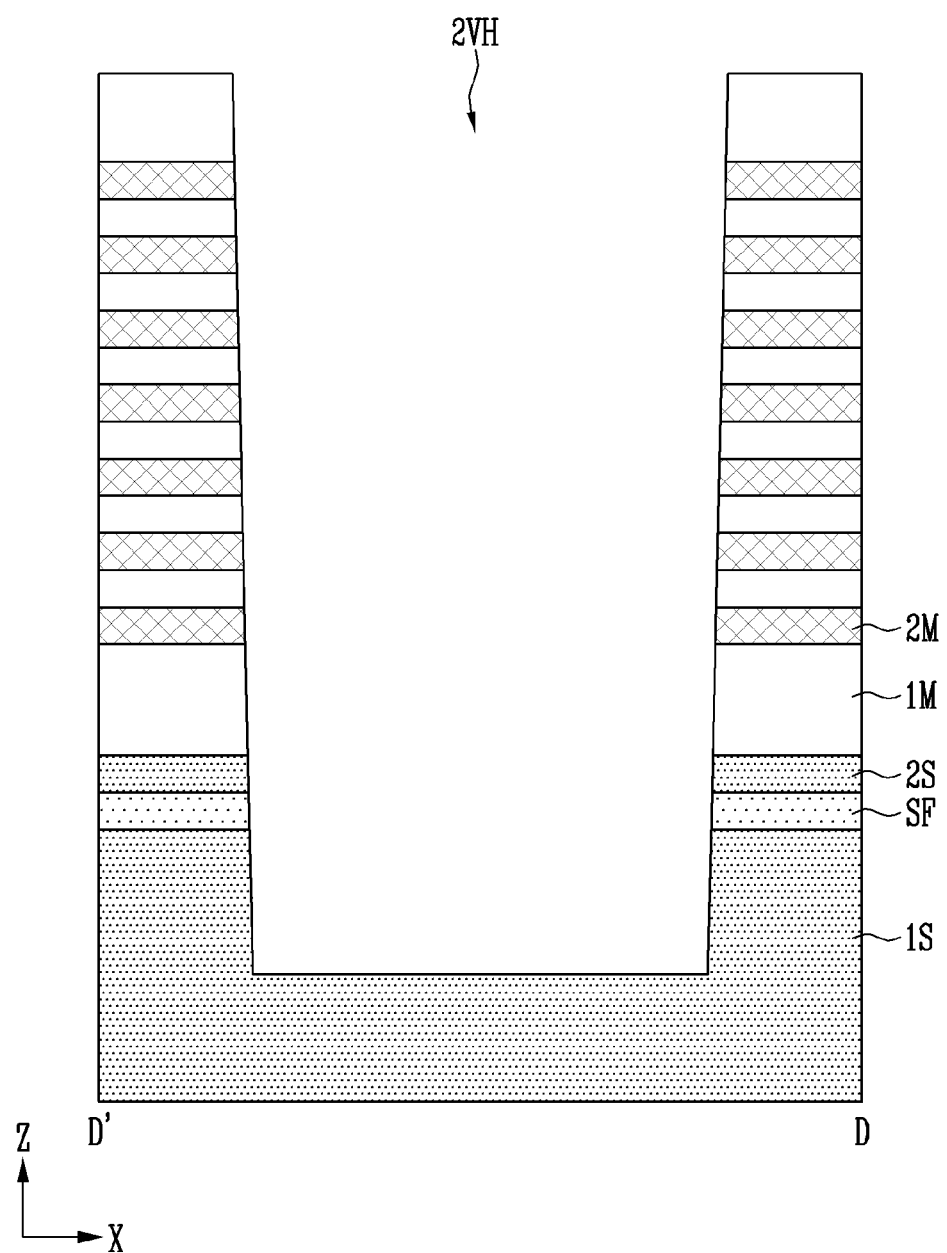
Figure 10F:
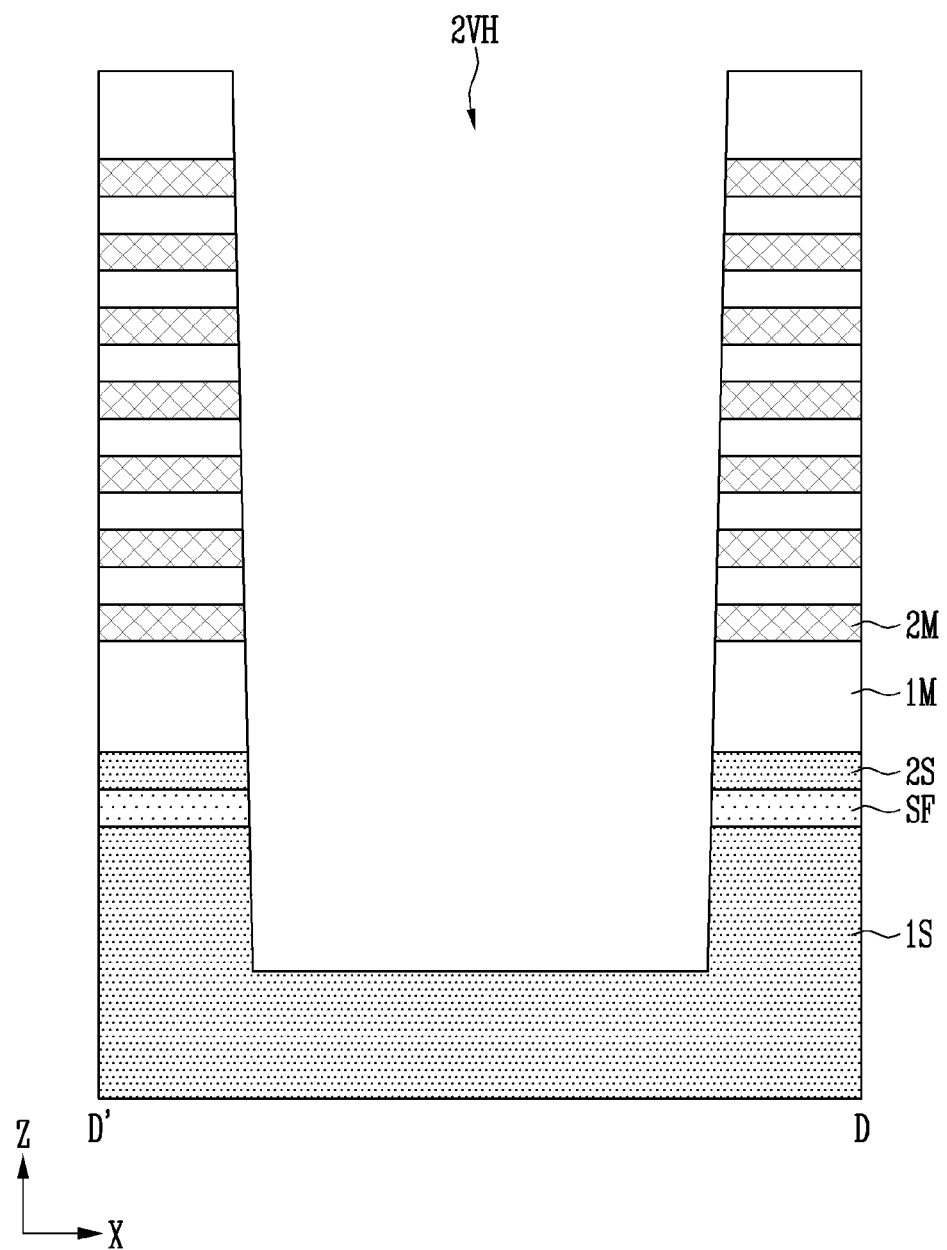
Figure 10G:
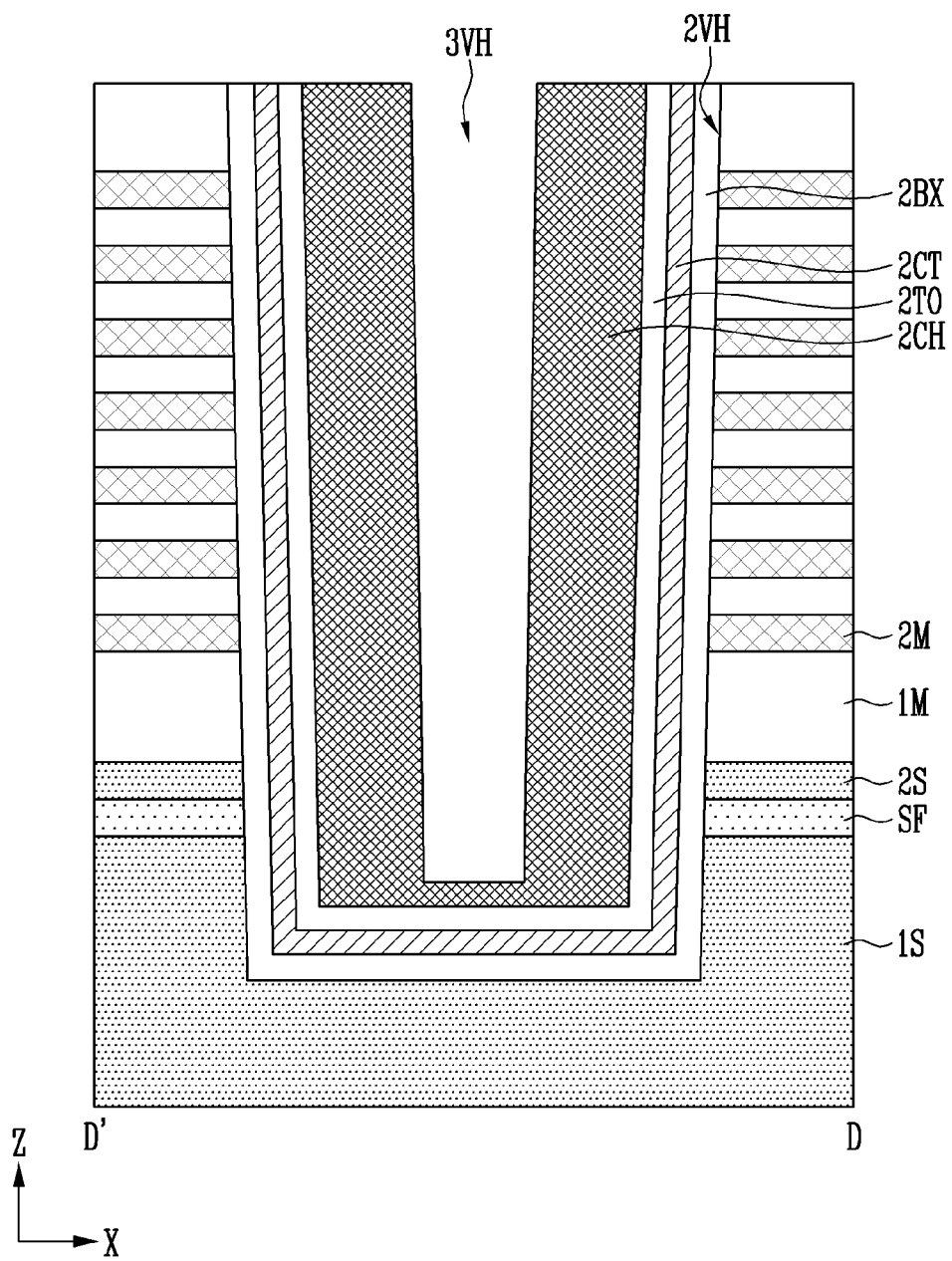
Figure 10H:
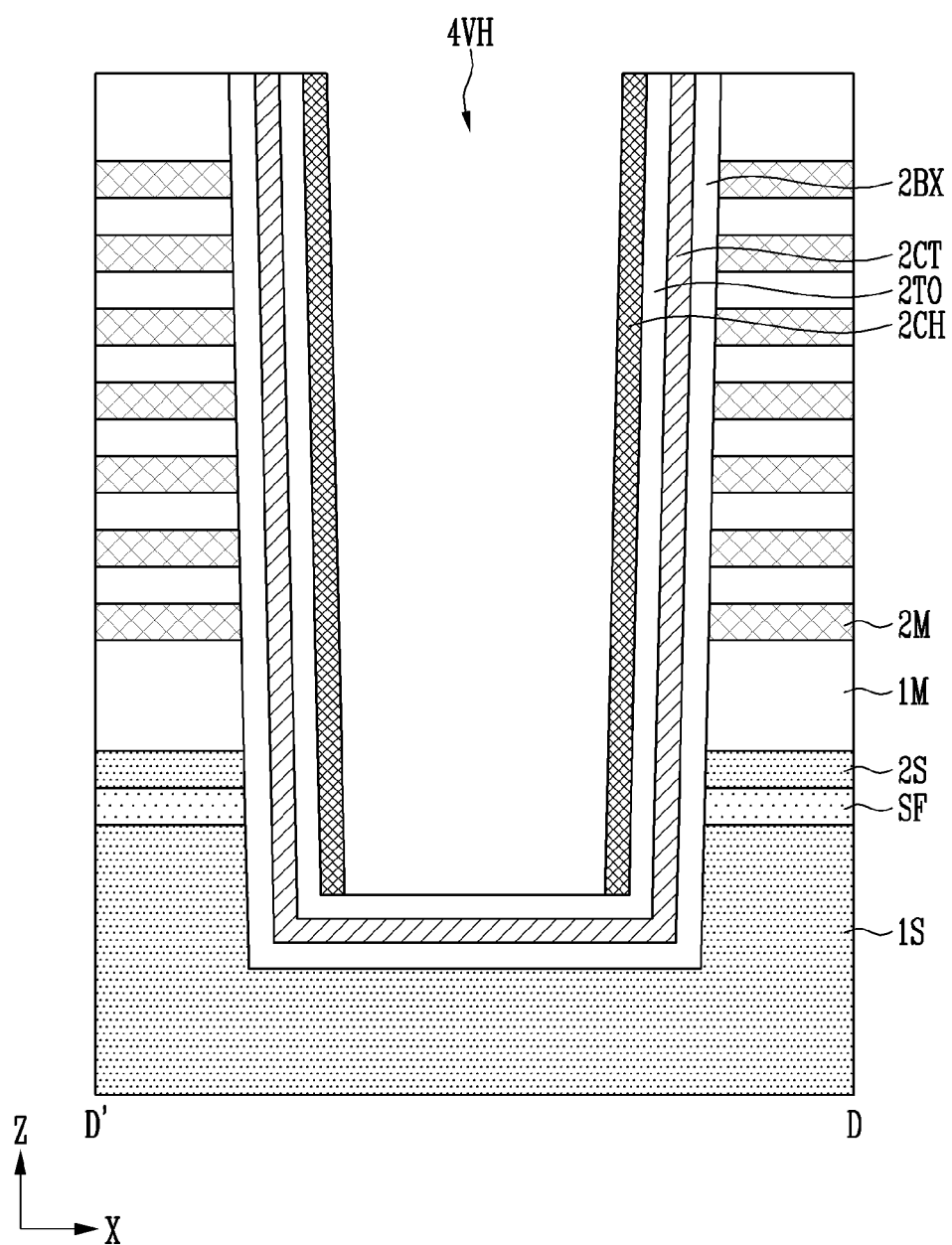
Figure 10I:
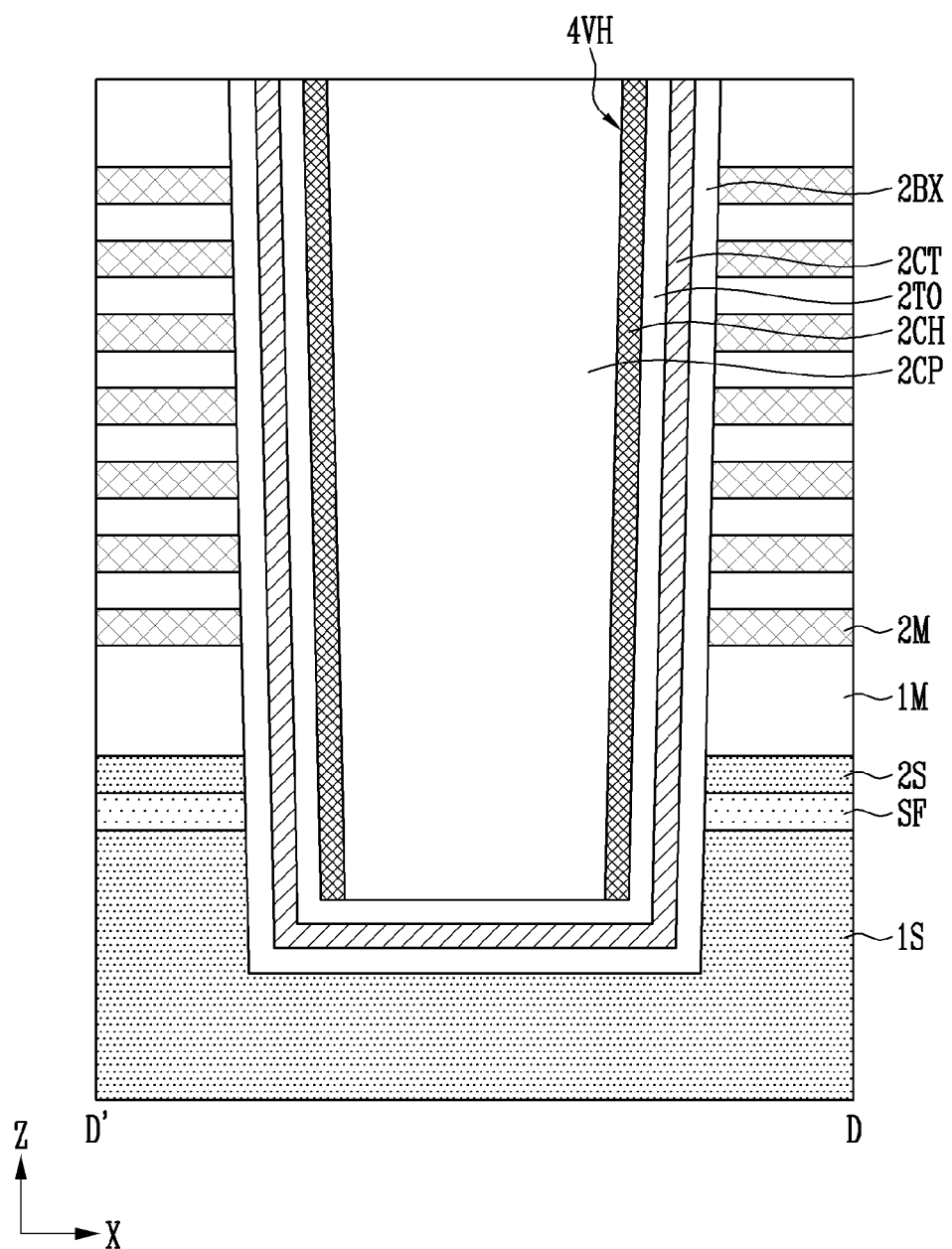
Figure 10J:
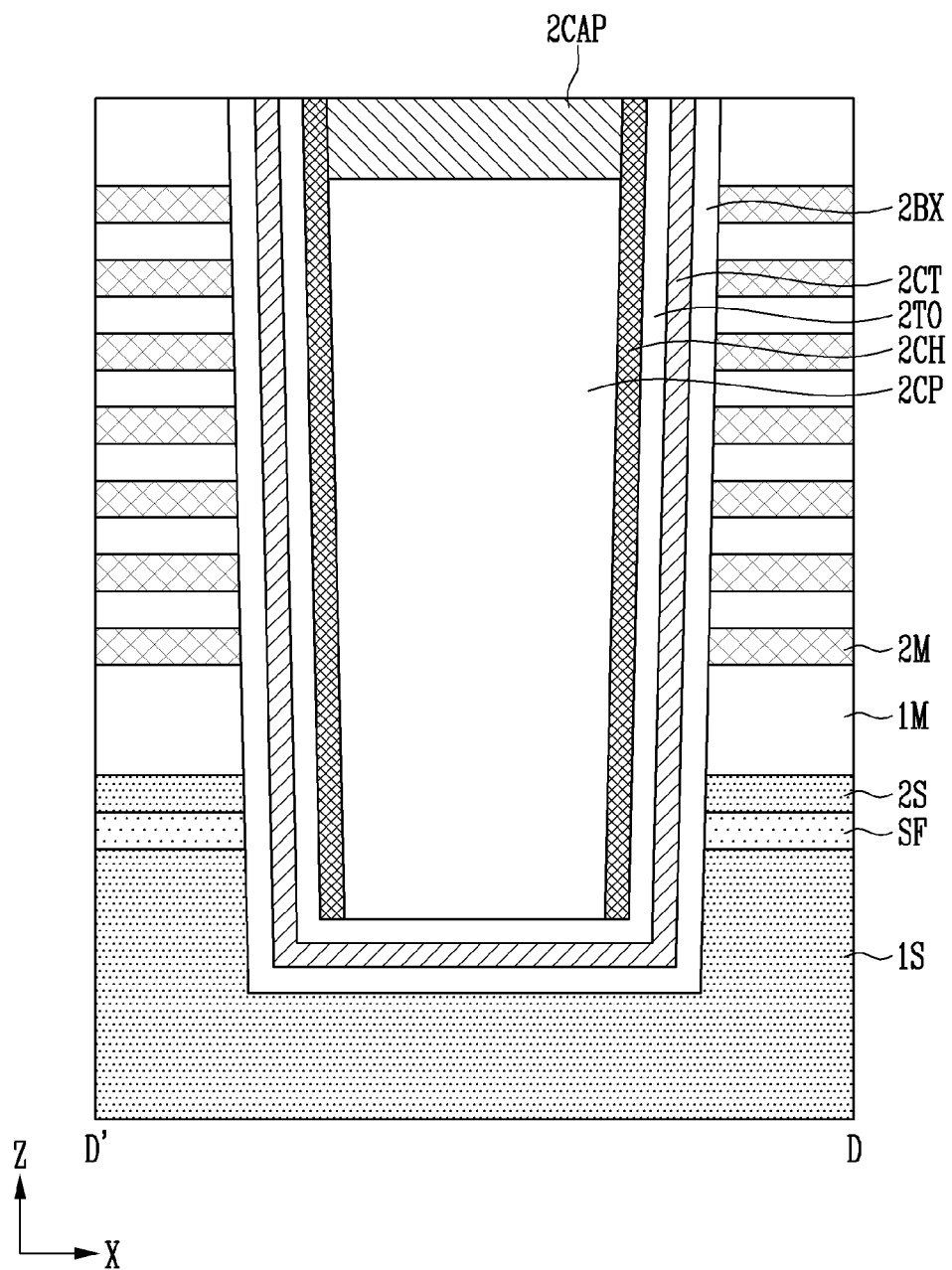
Figure 10K:
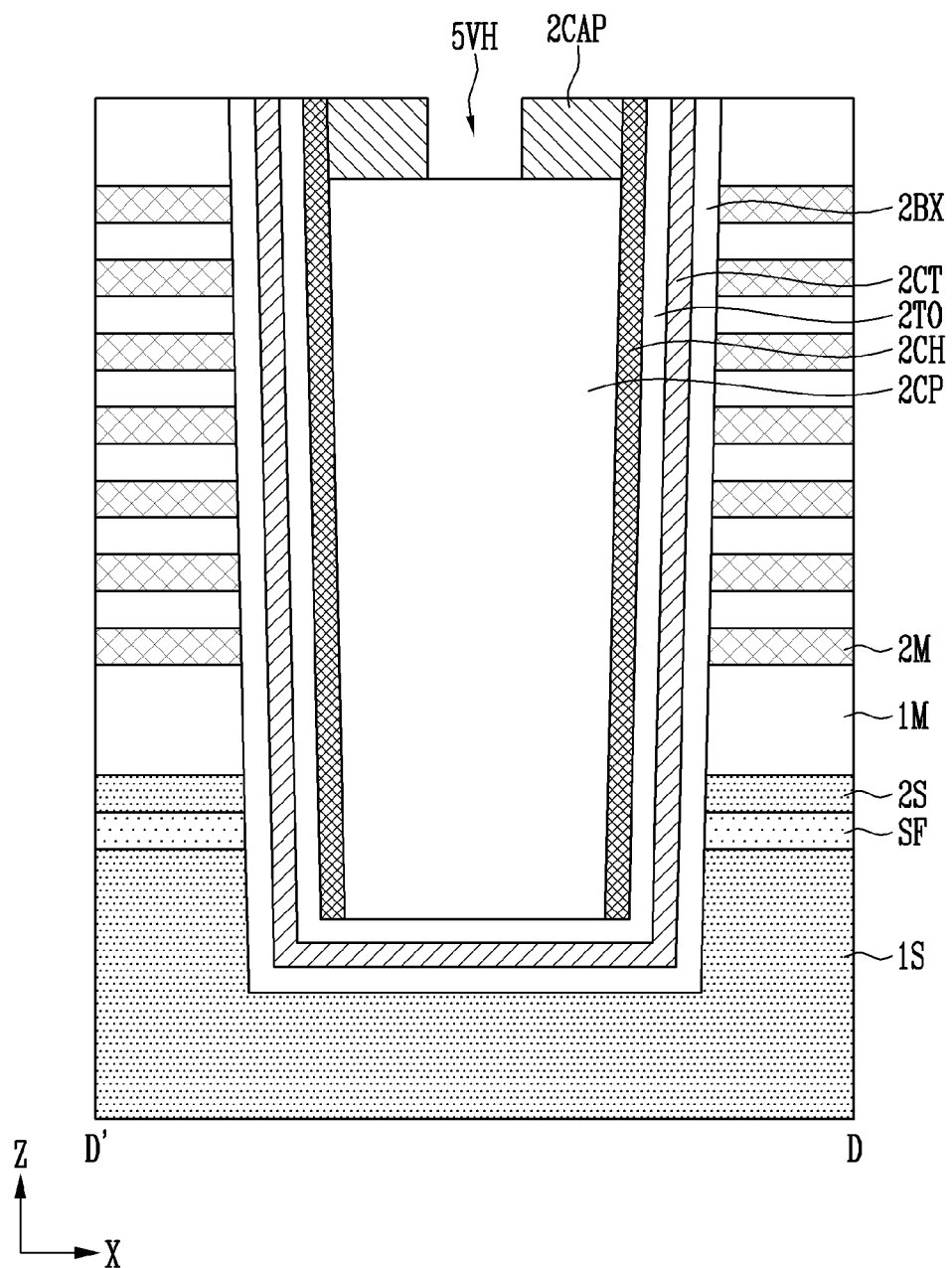
Figure 10L:
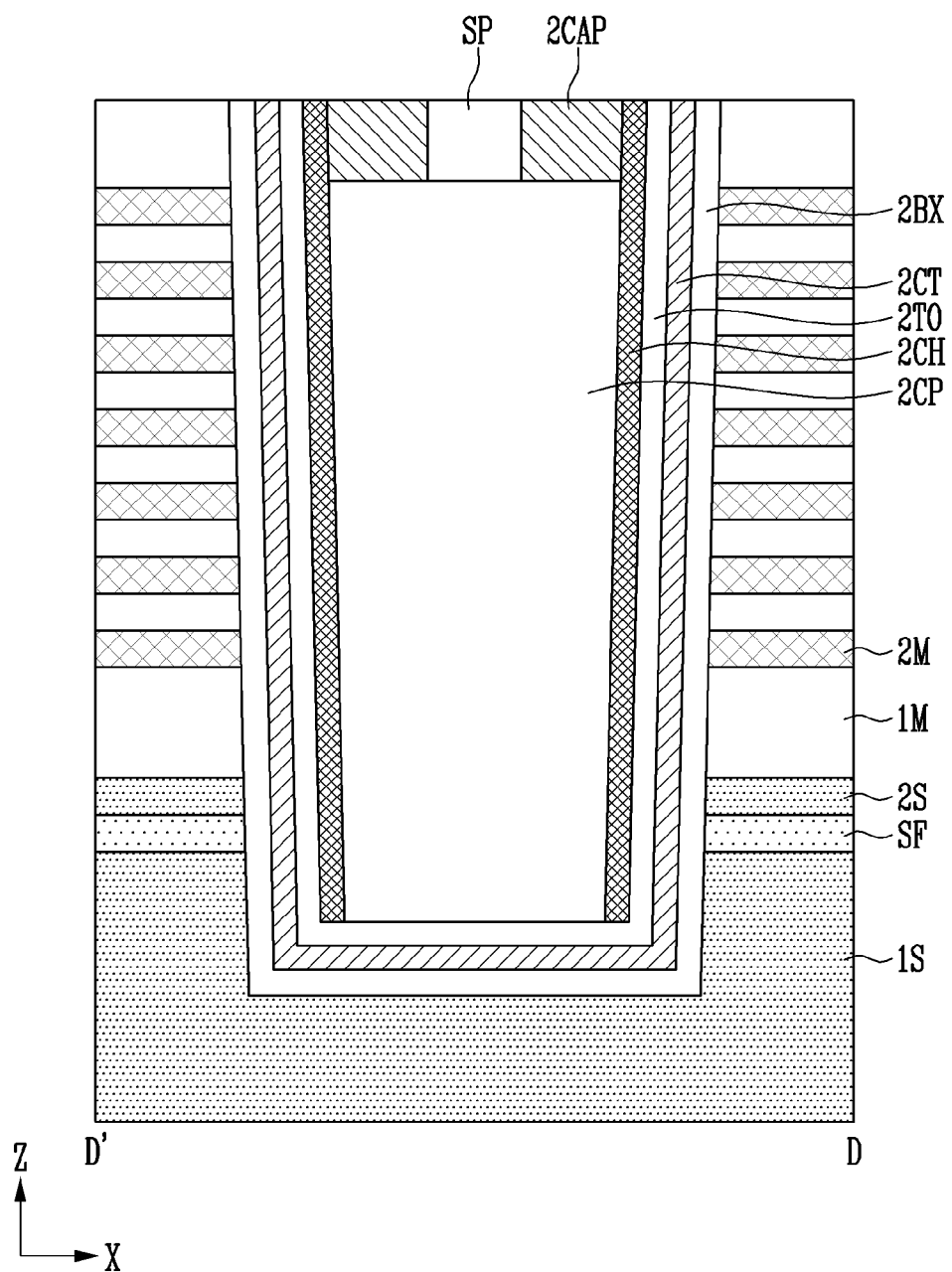
Figure 10M:
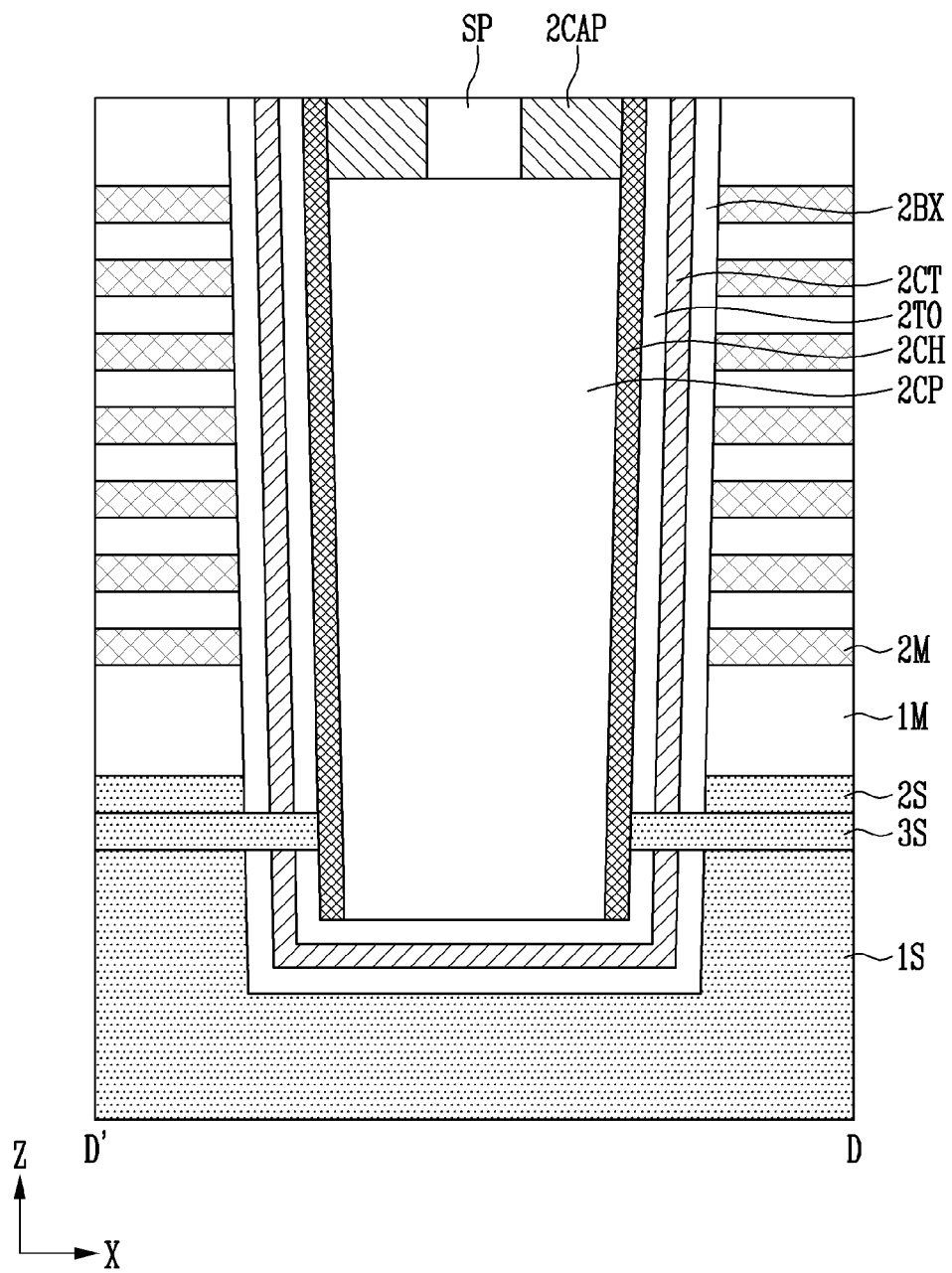
Figure 10N:
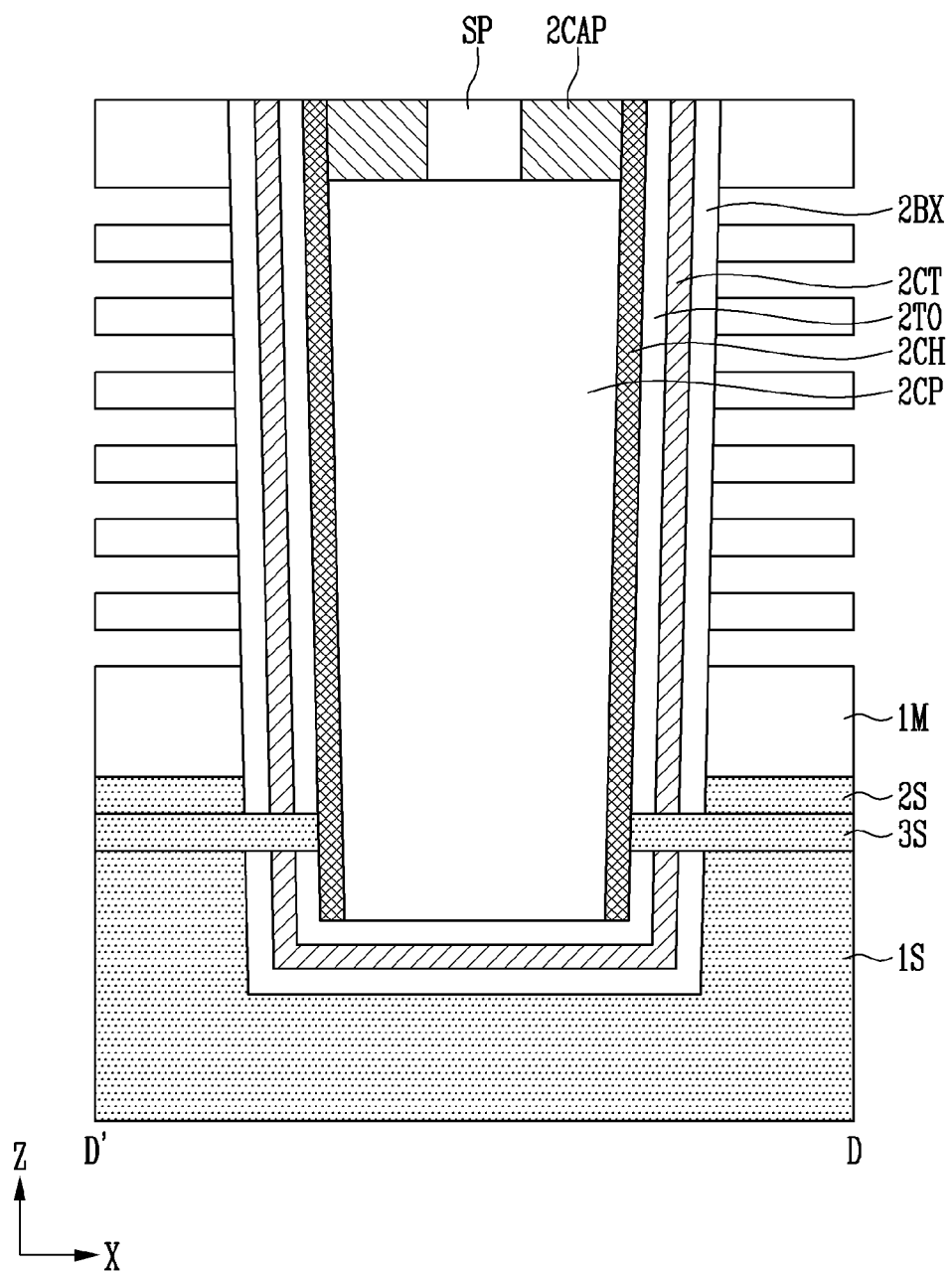
Figure 10O:
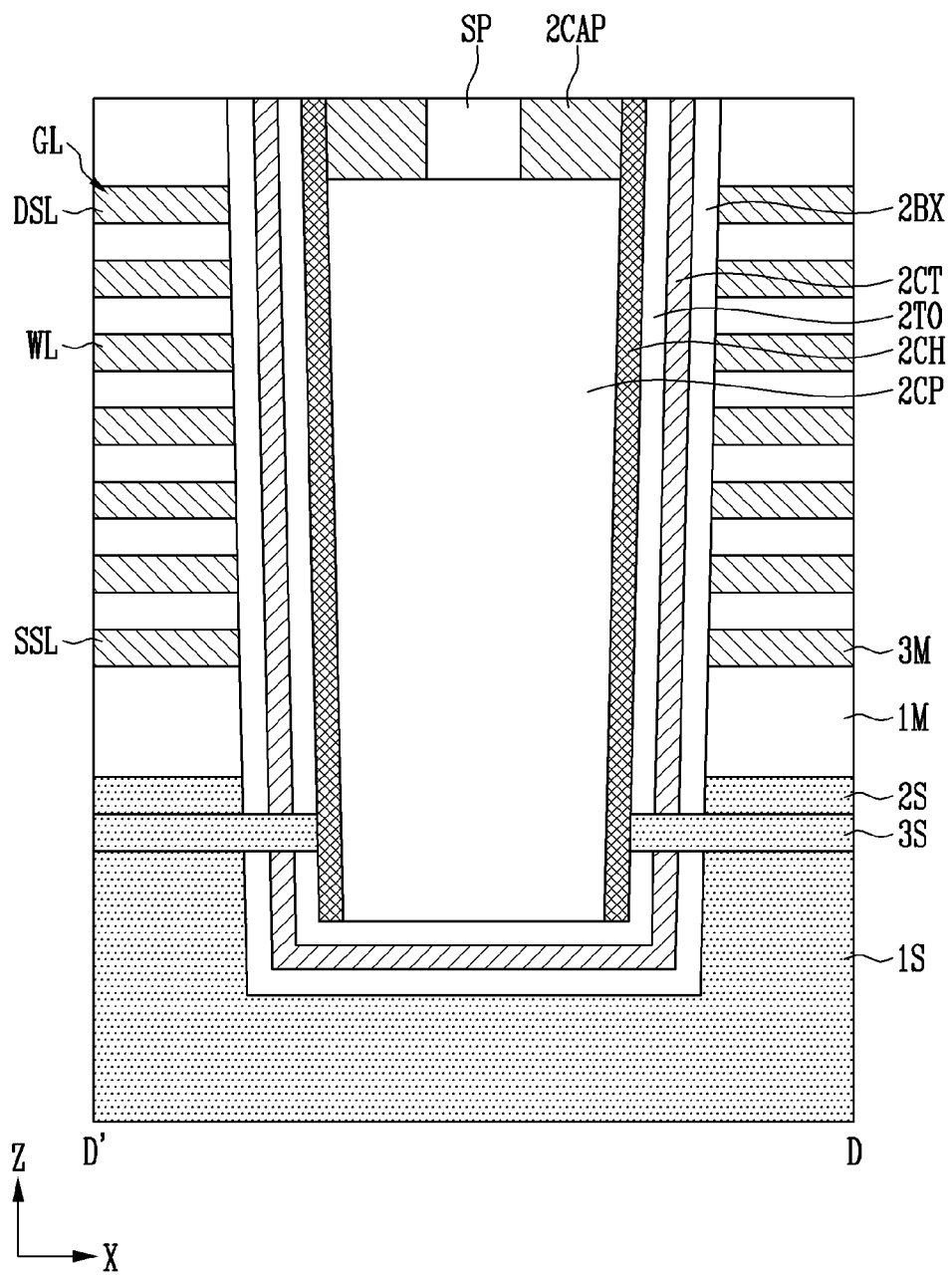

FIGS. 8A to 8L illustrate layouts for describing a method of manufacturing a memory device according to an embodiment of the present disclosure, FIGS. 9A to 9O are sectional views in a Y-axis direction for describing a method of manufacturing a memory device according to an embodiment of the present disclosure, and FIGS. 10A to 10O are sectional views in an X-axis direction for describing a method of manufacturing a memory device according to an embodiment of the present disclosure.

FIGS. 9A to 9O illustrate the structure of a section taken along line C-C' of FIGS. 8A to 8L, and FIGS. 10A to 10O illustrate the structure of a section taken along line D-D' of FIGS. 8A to 8L.

Referring to FIGS. 8A, 9A, and 10A, a first source layer 1S, a sacrificial layer SF, and a second source layer 2S may be stacked on a lower structure (not illustrated). The lower structure (not illustrated) may be a substrate or a structure including peripheral circuits. Because the first source layer 1S is a layer used as a source line, it may be formed of a conductive material. The second source layer 2S may be formed of the same material as the first source layer 1S. For example, each of the first source layer 1S and the second source layer 2S may be formed of a conductive material such as polysilicon, tungsten, or nickel. The sacrificial layer SF may be formed of a material having an etch selectivity with respect to the first source layer 1S.

To protect the first and second source layers 1S and 2S in a subsequent process, a buffer layer may be further formed between the first source layer 1S and the sacrificial layer SF and between the second source layer 2S and the sacrificial layer SF. For example, the buffer layer may be formed of an oxide layer.

Referring to FIGS. 8B, 9B, and 10B, first and second material layers 1M and 2M may be alternately stacked on the second source layer 2S. For example, when a first material layer 1M is formed on the second source layer 2S, a second material layer 2M may be formed on the first material layer 1M, and a first material layer 1M may be formed again on the second material layer 2M. Each of the first material layers 1M may be formed of an insulating material. For example, each of the first material layers 1M may be formed of an oxide layer or a silicon oxide layer. Each of the second material layers 2M may be formed of a material that can be selectively removed in a subsequent process. Therefore, the second material layers 2M may be formed of a material having an etch selectivity different from that of the first material layers 1M. For example, each of the second material layers 2M may be formed of a nitride layer. In a structure in which the first and second material layers 1M and 2M are stacked, the first material layers 1M may be formed in the lowermost portion and the uppermost portion of the structure.

Referring to FIGS. 8C, 9C, and 10C, a first vertical hole 1VH for exposing the first source layer 1S may be formed in a cell region of a memory block. For example, an etching process of removing portions of the first and second material layers 1M and 2M and an etching process of removing portions of the second source layer 2S, the sacrificial layer SF, and the first source layer 1S may be performed. The etching process may be performed as a dry etching process so that the first vertical hole 1VH is formed in a direction vertical to the substrate. The first vertical hole 1VH may be formed in a region in which the first channel structure 1CH_ST is to be formed. The major axis of the first vertical hole 1VH indicates a Y direction, and the minor axis thereof indicates an X direction. When the etching process of forming the first vertical hole 1VH is terminated, the first source layer 1S may be exposed through a bottom surface of the first vertical hole 1VH, and the first and second material layers 1M and 2M, the second source layer 2S, and the sacrificial layer SF may be exposed through a side surface of the first vertical hole 1VH.

Referring to FIGS. 8D, 9D, and 10D, the first channel structure 1CH_ST may be formed in the first vertical hole 1VH. The first channel structure 1CH_ST may include a first blocking layer 1BX, a first charge trap layer 1CT, a first tunnel insulating layer 1TO, a first channel layer 1CH, and a first core pillar 1CP. For example, the first blocking layer 1BX may be formed along an inner surface of the first vertical hole 1VH formed in a cylindrical shape. Because the first blocking layer 1BX does not completely fill the first vertical hole 1VH, it may be formed in a cylindrical shape. Thereafter, the first charge trap layer 1CT may be formed in a cylindrical shape along an inner surface of the first blocking layer 1BX, and the first tunnel insulating layer 1TO may be formed in a cylindrical shape along an inner surface of the first charge trap layer 1CT. The first channel layer 1CH may be formed in a cylindrical shape along an inner surface of the first tunnel insulating layer 1TO, and an inner space enclosed with the first channel layer 1CH may be filled with the first core pillar 1CP.

Referring to FIGS. 8E, 9E, and 10E, a second vertical hole 2VH for separating the first channel structure 1CH_ST in a Y-axis direction may be formed. An etching process may be performed to form the second vertical hole 2VH. The etching process may be performed as a dry etching process so that the second vertical hole 2VH is formed in a direction vertical to the substrate. The second vertical hole 2VH may be formed in a region in which a second channel structure 2CH_ST is to be formed. The major axis of the second vertical hole 2VH indicates an X direction, and the minor axis thereof indicates a Y direction. The etching process may be performed until the first source layer 1S in the cell region is exposed such that the first channel layer 1CH included in the first channel structure 1CH_ST is separable. When the etching process of forming the second vertical hole 2VH is terminated, the first source layer may be exposed through a bottom surface of the second vertical hole 2VH, and the first blocking layer 1BX, the first charge trap layer 1CT, the first tunnel insulating layer 1TO, the first channel layer 1CH, the first core pillar 1CP, and the first capping layer 1CAP may be exposed through a side surface of the second vertical hole 2VH. The first channel structure 1CH_ST may be separated into a first memory cell group 1MC and a second memory cell group 2MC by the second vertical hole 2VH. Referring to FIGS. 8F, 9F, and 10F, a compensation layer CF may be formed in a region in which the first channel layer 1CH contacts the second vertical hole 2VH. The compensation layer CF may protect the surface of the first channel layer 1CH exposed in the process of forming the second vertical hole 2VH through etching to form the second channel structure 2CH_ST. The compensation layer may be made of an insulating material, for example, an oxide or silicon oxide. However, the compensation layer CF may be a selective structure, and may be omitted.

Referring to FIGS. 8G, 9G, and 10G, a second channel structure 2CH_ST may be formed in the second vertical hole 2VH. The second channel structure 2CH_ST may include a second blocking layer 2BX, a second charge trap layer 2CT, a second tunnel insulating layer 2TO, and a second channel layer 2CH. For example, the second blocking layer 2BX may be formed along an inner surface of the second vertical hole 2VH formed in a cylindrical shape. The second blocking layer 2BX may be formed in a cylindrical shape which does not completely fill the second vertical hole 2VH. Thereafter, the second charge trap layer 2CT may be formed in a cylindrical shape along an inner surface of the second blocking layer 2BX, and the second tunnel insulating layer 2TO may be formed in a cylindrical shape along an inner surface of the second charge trap layer 2CT. The second channel layer 2CH may be formed in a cylindrical shape along an inner surface of the second tunnel insulating layer 2TO.

The second channel layer 2CH may be formed to have a structure including a third vertical hole 3VH therein. The major axis of the third vertical hole 3VH indicates an X direction, and the minor axis thereof indicates a Y direction. The length of the major axis of the third vertical hole 3VH needs to be less than that of the major axis of the second channel layer 2CH, and the length of the minor axis of the third vertical hole 3VH needs to be less than that of the minor axis of the second channel layer 2CH.

Referring to FIGS. 8H, 9H, and 10H, a fourth vertical hole 4VH may be formed in the second channel structure 2CH_ST. An etching process may be performed to form the fourth vertical hole 4VH. The etching process may be performed as a wet etching process. The etching process may be performed until the second tunnel insulating layer 2TO is exposed such that the second channel layer 2CH included in the second channel structure 2CH_ST is separable. When the etching process of forming the fourth vertical hole 4VH is terminated, the second tunnel insulting layer 2TO may be exposed through a bottom surface of the fourth vertical hole 4VH, the second channel layer 2CH may be exposed through a side surface of the fourth vertical hole 4VH in the X direction, and the second tunnel insulating layer 2TO may be exposed through a side surface of the fourth vertical hole 4VH in the Y direction. The second channel structure 2CH_ST may be separated into a third memory cell group 3MC and a fourth memory cell group 4MC by the fourth vertical hole 4VH.

Referring to FIGS. 8I, 9I, and 10I, a second core pillar 2CP may be formed in the fourth vertical hole 4VH. The second core pillar 2CP may be formed of an insulating material or a conductive material.

Referring to FIGS. 83, 93, and 103, first and second capping layers 1CAP and 2CAP may be formed on the first and second core pillars 1CP and 2CP, respectively. An etching process of removing partial upper portions of the first and second core pillars 1CP and 2CP may be performed to form the first and second capping layers 1CAP and 2CAP, and the first and second capping layers 1CAP and 2CAP may be formed in respective regions from which the partial upper portions of the first and second core pillars 1CP and 2CP are removed.

Referring to FIGS. 8K, 9K, and 10K, a fifth vertical hole 5VH for forming a separation pattern SP may be formed. To form the fifth vertical hole 5VH, an etching process of removing a portion of the second capping layer 2CAP may be formed. The etching process may be performed as a dry etching process. The etching process may be performed until the second tunnel insulating layer 2TO is exposed. When the etching process of forming the fifth vertical hole 5VH is terminated, the second tunnel insulating layer 2TO may be exposed in the Y direction of the fifth vertical hole 5VH, and the second capping layer 2CAP may be exposed in the X direction of the fifth vertical hole 5VH. Each of the second capping layer 2CAP and the second channel layer 2CH may be separated by the fifth vertical hole 5VH.

Referring to FIGS. 8L, 9L, and 10L, a separation pattern SP may be formed in the fifth vertical hole 5VH. The separation pattern SP may be formed of the same material as the second core pillar 2CP. For example, the separation pattern SP may be made of a conductive material or an insulating material.

Referring to FIGS. 8L, 9M, and 10M, an etching process of removing the sacrificial layer SF may be performed through a trench-shaped slit for separating the first and second material layers 1M and 2M. Subsequently, portions of the first blocking layer 1BX, the first charge trap layer 1CT, and the first tunnel insulating layer 1TO in a region in which the first channel structure 1CH_ST contacts the sacrificial layer SF may be removed. However, in the case where the compensation layer CF is formed, the compensation layer CF may also be removed together with the portions of the elements. Here, portions of the second blocking layer 2BX, the second charge trap layer 2CT, and the second tunnel insulating layer 2TO in a region contacting the compensation layer CF may also be removed together.

A third source layer 3S may be formed in a region from which the sacrificial layer SF and the portions of the first blocking layer 1BX, the first charge trap layer 1CT, and the first tunnel insulating layer 1TO are removed. Here, the third source layer 3S may be formed to contact the first channel layer 1CH on a bottom surface of the first channel structure 1CH_ST. The third source layer 3S may be formed of the same material as the first or second source layer 1S or 2S. For example, the third source layer 3S may be formed of a conductive material, such as polysilicon, tungsten, or nickel. Therefore, a source line SL composed of the first to third source layers 1S to 3S may be formed.

Referring to FIGS. 8L, 9N, and 10N, an etching process of removing the second material layers 2M may be performed through a trench-shaped slit. The etching process may be performed as a wet etching process using etchant, which allows the first material layers 1M to remain and selectively removes the second material layers 2M.

Referring to FIGS. 8L, 9O, and 10O, third material layers 3M may be formed in regions from which the second material layers 2M are removed. Because the third material layers 3M are used as a gate line GL, they may be made of a conductive material. For example, each of the third material layers 3M may be made of tungsten (W), cobalt (Co), nickel (Ni), molybdenum (Mo), silicon (Si), polysilicon (poly-Si), or the like.

Figure 11:
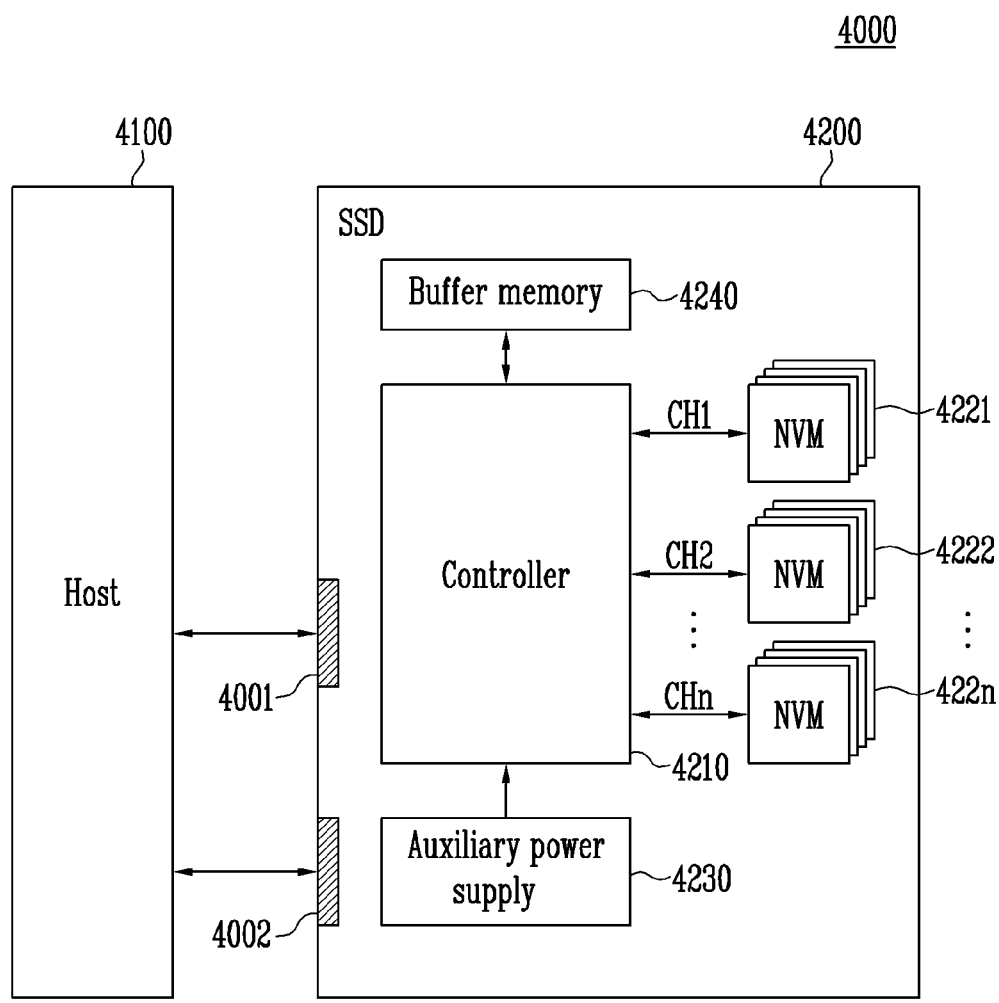
FIG. 11 is a diagram illustrating a solid-state drive (SSD) system to which a memory device according to the present disclosure is applied.

FIG. 11 is a diagram illustrating a solid-state drive (SSD) system to which a memory device according to the present disclosure is applied.

Referring to FIG. 11, an SSD system 4000 may include a host 4100 and an SSD 4200. The SSD 4200 may exchange signals with the host 4100 through a signal connector 4001 and may exchange power through a power connector 4002. The SSD 4200 may include a controller 4210, a plurality of memory devices 4221 to 422n, an auxiliary power supply 4230, and a buffer memory 4240.

The controller 4210 may control the plurality of memory devices 4221 to 422n in response to signals received from the host 4100. In an embodiment, the signals may be transmitted based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe).

Each of the plurality of memory devices 4221 to 422n may include a plurality of memory cells configured to store data. Each of the memory devices 4221 to 422n may be configured in the same manner as the memory device 100 illustrated in FIG. 1. The plurality of memory devices 4221 to 422n may communicate with the controller 4210 through channels CH1 to CHn.

The auxiliary power supply 4230 may be coupled to the host 4100 through the power connector 4002. The auxiliary power supply 4230 may be supplied with a supply voltage from the host 4100 and may be charged. The auxiliary power supply 4230 may provide the supply voltage of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located in a main board and may also provide auxiliary power to the SSD 4200.

The buffer memory 4240 may function as a buffer memory of the SSD 4200. For example, the buffer memory 4240 may temporarily store data received from the host 4100 or data received from the plurality of memory devices 4221 to 422n, or may temporarily store metadata (e.g., mapping tables) of the memory devices 4221 to 422n. The buffer memory 4240 may include volatile memory, such as dynamic random access memory (DRAM), synchronous DRAM (SDRAM), double data rate (DDR) SDRAM, and low power DDR (LPDDR) SDRAM, or the buffer memory 4240 may include nonvolatile memory, such as ferroelectric RAM (FRAM), resistive RAM (ReRAM), spin transfer torque magnetic RAM (STT-MRAM), and phase-change RAM (PRAM).

Figure 12:
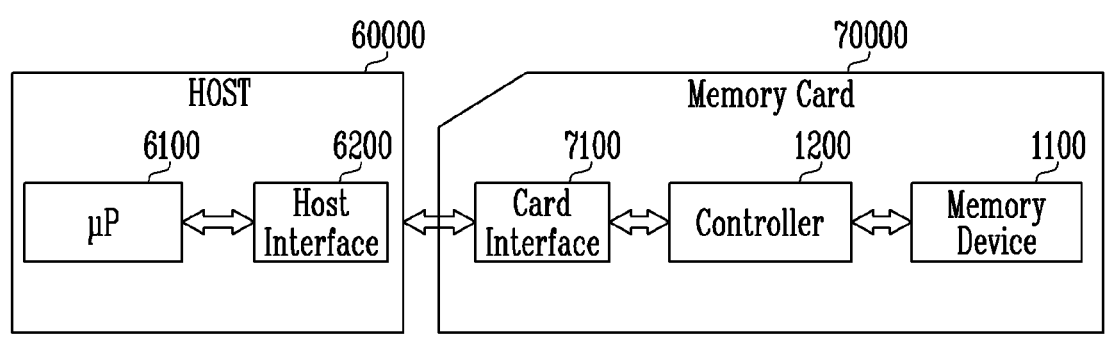
FIG. 12 is a diagram illustrating a memory card system to which a memory device according to the present disclosure is applied.

FIG. 12 is a diagram illustrating a memory card system to which a memory device according to the present disclosure is applied.

Referring to FIG. 12, a memory system 70000 may be implemented as a memory card or a smart card. The memory system 70000 may include a memory device 1100, a controller 1200, and a card interface 7100.

The memory device 1100 may be configured in the same manner as the memory device 100 illustrated in FIG. 1.

The controller 1200 may control data exchange between the memory device 1100 and the card interface 7100. In an embodiment, the card interface 7100 may be, but is not limited to, a secure digital (SD) card interface or a multimedia card (MMC) interface.

The card interface 7100 may interface data exchange between a host 60000 and the controller 1200 according to the protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method.

When the memory system 70000 is coupled to a host interface 6200 of the host 60000 such as a PC, a tablet PC, a digital camera, a digital audio player, a mobile phone, console video game hardware, or a digital set-top box, the host interface 6200 may perform data communication with the memory device 1100 through the card interface 7100 and the controller 1200 under the control of a microprocessor (µP) 6100.

In accordance with an embodiment of the present disclosure, the degree of integration of a memory device may be improved.

What is claimed is:

1. A memory device, comprising:
   a stacked structure including gate lines stacked to be spaced apart from each other;
   a first channel structure vertical to the gate lines and including a major axis in a first direction; and
   a second channel structure configured to separate the first channel structure, and including a major axis in a second direction orthogonal to the first direction,
   wherein the first channel structure comprises a first memory cell group and a second memory cell group separated from each other by the second channel structure, and
   wherein the second channel structure comprises a third memory cell group and a fourth memory cell group separated from each other in the second direction.

2. The memory device according to claim 1, wherein the second channel structure is disposed between the first memory cell group and the second memory cell group.

3. The memory device according to claim 1, wherein each of the first, second, third, and fourth memory cell groups includes a core pillar, a channel layer, a tunnel insulating layer, a charge trap layer, and a blocking layer that are formed in a direction vertical to the gate lines.

4. The memory device according to claim 3, wherein the core pillar of the third memory cell group is connected with the channel layer of the third memory cell group and the tunnel insulating layers of the third memory cell group.

5. The memory device according to claim 3, wherein the third and fourth memory cell groups include capping layers separated from each other by a separation pattern.

6. The memory device according to claim 5, wherein the separation pattern is connected to a part of the tunnel insulating layers of the third memory cell group and a part of the tunnel insulating layer of the fourth memory cell group.

7. The memory device according to claim 5, wherein the separation pattern comprises an insulating material.

8. The memory device according to claim 5, wherein a diameter of the separation pattern is equal to or greater than a length of a minor axis of a channel layer of each of the third memory cell group and the fourth memory cell group.

9. The memory device according to claim 5, wherein a length of a minor axis of each of the capping layers is equal to or greater than a length of a minor axis of a channel layer of each of the third memory cell group and the fourth memory cell group.

10. The memory device according to claim 5, wherein a length of a major axis of each of the capping layers is equal to or smaller than a length of a major axis of a channel layer of each of the third memory cell group and the fourth memory cell group.

11. The memory device according to claim 3, further comprising:
a compensation layer formed between the channel layer of each of the first memory cell group and the second memory cell group and the second channel structure.

12. A method of manufacturing a memory device, the method comprising:
forming a stacked structure including gate lines on a lower structure;
forming a first channel structure arranged in a direction vertical to the gate lines;
forming a second channel structure configured to separate memory cells included in the first channel structure into first and second memory cell groups; and
separating memory cells included in the second channel structure into third and fourth memory cell groups.

13. The method according to claim 12, wherein forming the first channel structure comprises:
stacking first and second material layers on the lower structure;
forming a first vertical hole arranged in a direction vertical to the first and second material layers; and
forming a first blocking layer, a first charge trap layer, a first tunnel insulating layer, a first channel layer, and a first core pillar along an inner wall of the first vertical hole.

14. The method according to claim 12, wherein:
the first channel structure is formed having a major axis in a first direction, and
the second channel structure is formed having a major axis in a second direction orthogonal to the first direction.

15. The method according to claim 12, wherein forming the second channel structure comprises:
forming a second vertical hole configured to separate the first channel structure; and
forming a second blocking layer, a second charge trap layer, a second tunnel insulating layer, and a second channel layer along an inner wall of the second vertical hole.

16. The method according to claim 15, wherein separating the memory cells included in the second channel structure into the third and fourth memory cell groups comprises:
forming a fourth vertical hole configured to separate the second channel layer; and
forming a second core pillar along an inner wall of the fourth vertical hole.

17. The method according to claim 15, further comprising:
after forming the second vertical hole, forming a compensation layer connected with the first channel layer through the second vertical hole.

18. The method according to claim 15, further comprising:
forming a second capping layer on the second channel structure connected to the second channel layer and the second tunnel insulating layer.

19. The method according to claim 18, wherein separating the second capping layer comprises:
forming a fifth vertical hole configured to separate the second capping layer; and
forming a separation pattern along an inner wall of the fifth vertical hole.

20. The method according to claim 19, wherein a length of a minor axis of the separation pattern is equal to or greater than a length of a minor axis of the second channel layer.

21. The method according to claim 18, wherein a length of a minor axis of the second capping layer is equal to or greater than a length of a minor axis of the second channel layer.

* * * * *